United States Patent
Takemura et al.

(10) Patent No.: US 9,519,217 B2
(45) Date of Patent: Dec. 13, 2016

(54) CHEMICALLY AMPLIFIED POSITIVE RESIST COMPOSITION AND PATTERNING PROCESS

(71) Applicant: Shin-Etsu Chemical Co., Ltd., Tokyo (JP)

(72) Inventors: Katsuya Takemura, Joestsu (JP); Yoshinori Hirano, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/732,026

(22) Filed: Jun. 5, 2015

(65) Prior Publication Data

US 2015/0355543 A1 Dec. 10, 2015

(30) Foreign Application Priority Data

Jun. 9, 2014 (JP) ................. 2014-118737

(51) Int. Cl.
G03F 7/039 (2006.01)
G03F 7/16 (2006.01)
G03F 7/20 (2006.01)
G03F 7/38 (2006.01)
G03F 7/42 (2006.01)

(52) U.S. Cl.
CPC ........... *G03F 7/0392* (2013.01); *G03F 7/0397* (2013.01); *G03F 7/16* (2013.01); *G03F 7/20* (2013.01); *G03F 7/38* (2013.01); *G03F 7/427* (2013.01)

(58) Field of Classification Search
CPC .................................................. G03F 7/0392
See application file for complete search history.

(56) References Cited

U.S. PATENT DOCUMENTS

| | | | |
|---|---|---|---|
| 5,942,369 A | 8/1999 | Ota et al. | |
| 6,165,680 A | 12/2000 | Choi | |
| 6,635,400 B2 | 10/2003 | Kato et al. | |
| 6,911,292 B2 | 6/2005 | Furihata et al. | |
| 8,968,982 B2 | 3/2015 | Yasuda et al. | |
| 2001/0031421 A1* | 10/2001 | Takeda et al. | G03F 7/039 430/326 |
| 2009/0233223 A1 | 9/2009 | Tachibana et al. | |
| 2011/0200941 A1 | 8/2011 | Masunaga et al. | |
| 2012/0184101 A1* | 7/2012 | Yasuda et al. | G03F 7/0392 430/326 |
| 2013/0026044 A1 | 1/2013 | Yasuda et al. | |
| 2014/0065545 A1 | 3/2014 | Hatakeyama et al. | |

FOREIGN PATENT DOCUMENTS

| | | |
|---|---|---|
| EP | 0 588 492 A1 | 3/1994 |
| EP | 210217 A1 | 9/2009 |
| EP | 2101217 A1 | 9/2009 |
| EP | 2360527 A1 | 8/2011 |
| EP | 2 551 722 A1 * | 1/2012 |
| EP | 2551722 A1 | 1/2013 |
| JP | 46-016049 B | 4/1971 |
| JP | 06-202332 A | 7/1994 |
| JP | 10-207057 A | 8/1998 |
| JP | 2002-006503 A | 1/2002 |
| JP | 2004-198915 A | 7/2004 |
| JP | 4403627 B2 | 1/2010 |
| JP | 2012-163950 A | 8/2012 |

OTHER PUBLICATIONS

European Search Report dated Oct. 23, 2015 issued in counterpart European patent application No. 15170386.5. (4 pages).
European Search Report dated Oct. 23, 2015 issued in counterpart application No. 15170386.5 (4 pages).

* cited by examiner

*Primary Examiner* — Cynthia Hamilton
(74) *Attorney, Agent, or Firm* — Westerman, Hattori, Daniels & Adrian, LLP

(57) ABSTRACT

A chemically amplified positive resist composition is provided comprising a substantially alkali-insoluble polymer having an acid labile group-protected acidic functional group, a poly(meth)acrylate polymer having Mw of 1,000-500,000, and an acid generator in a solvent. The composition forms on a substrate a resist film of 5-100 μm thick which can be briefly developed to form a pattern at a high sensitivity and a high degree of removal or dissolution to bottom.

12 Claims, 1 Drawing Sheet

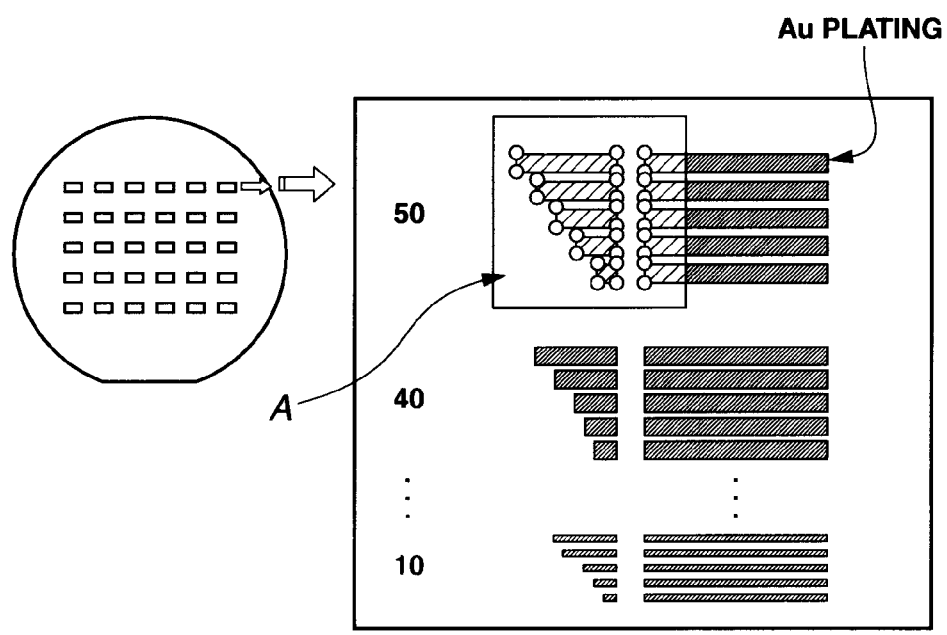

CHEMICALLY AMPLIFIED POSITIVE RESIST COMPOSITION AND PATTERNING PROCESS

CROSS-REFERENCE TO RELATED APPLICATION

This non-provisional application claims priority under 35 U.S.C. §119(a) on Patent Application No. 2014-118737 filed in Japan on Jun. 9, 2014, the entire contents of which are hereby incorporated by reference.

TECHNICAL FIELD

This invention relates to a chemically amplified positive resist composition which can be patterned by exposure to UV radiation having a wavelength of up to 500 nm (near and deep-UV regions), e.g., i- and g-lines, and a pattern forming process.

The resist composition is coated onto a substrate to form a relatively thick resist film of 5 to 100 μm thick which is exposed and developed to form a pattern. The composition has an improved sensitivity and allows for effective removal or dissolution near the substrate or at the pattern bottom. The development time can be reduced although a long time is otherwise required for the development of a thick resist film of 5 to 100 μm. While a chemically amplified positive resist composition containing a certain acid generator suffers from a problem that a footing or undercut phenomenon occurs when a resist pattern is formed on a metal substrate such as copper substrate, that is, the pattern profile is degraded, the invention overcomes the problem. When resist patterning is followed by electroplating or electroless plating to deposit a metal layer on the substrate, the resist pattern is resistant to deformation and cracking.

BACKGROUND ART

In harmony with the downsizing of electronic equipment, a rapid progress is recently made toward higher integration of LSIs and toward ASIC (application specific integrated circuits). For LSI mounting, multi-pin thin-film packaging is widely employed. Such multi-pin structures include protruding electrodes or solder bumps of at least 10 μm in height as the connecting terminal, while the technique for forming solder bumps is requisite. When bumps are formed on LSI by a plating technique, a photoresist material is used. While bumps of mushroom shape are formed using conventional thin film resist, such bump shape is difficult to increase the integration density by increasing the number of pins on LSI or reducing the pin spacing. It is then necessary to shape bumps with vertical sidewalls (or straight sidewalls) utilizing a thick film resist. The thick film photoresist subject to plating must fulfill many features including high sensitivity, vertical profile, and high resolution, as well as deformation resistance and crack resistance of the pattern during or after the plating step.

As the means for solving these problems, certain compositions are known in the art. For example, JP-A H10-207057 discloses a positive photoresist composition having an acrylic resin added for the main purpose of improving the plating resistance of bump-processing resist film. JP-B S46-16049 discloses an alkali-soluble photosensitive resin composition comprising a novolac resin, a naphthoquinonediazide-containing compound, and polyvinyl ether. Both the compositions are improved in crack resistance, but have a possibility that the pattern profile is degraded owing to the reduced contrast of resist film. Also a positive photoresist composition comprising a novolac resin and a hydrolyzate of an alkyl vinyl ether-maleic anhydride copolymer having a molecular weight of 20,000 to 80,000 is known from JP-A H06-202332. This system, however, is insufficient with respect to crack resistance during or after the plating step in the gold plating application.

On the other hand, since solder bumps must have a height of several tens of microns to about 100 microns (μm), the resist pattern formed therefor must accordingly have a depth of several tens of μm to about 100 μm. It is thus recommended that the resist material be coated as a very thick film having a thickness of several tens of μm to about 100 μm. This implies that the resist material adapted for solder bump pattern formation may have problems with respect to sensitivity and resist pattern profile. While positive resist compositions comprising a novolac resin and a naphthoquinonediazide-containing compound are commonly used in the art, as described in JP-B S46-16049 and JP-A 2004-198915, thick films thereof having a thickness of several tens of μm to about 100 μm are degraded in sensitivity, which reduces the productivity efficiency of pattern formation, causes the pattern profile to be tapered, and leads to profile deficiency against the requirement to shape bumps with vertical sidewalls (or straight sidewalls). For this reason, the solder bump-forming resist material requiring a film thickness of several tens of μm to about 100 μm prefers chemically amplified resist compositions to the positive resist compositions comprising a novolac resin and a naphthoquinonediazide-containing compound because a pattern with more vertical sidewalls can be formed at a higher sensitivity.

In connection with the chemically amplified resist composition used as the solder bump-forming resist material requiring a film thickness of several tens of μm to about 100 μm, when polyhydroxystyrene in which some phenolic hydroxyl groups are substituted with acetal groups as acid labile group is used as the base resin (JP-A 2002-006503), a problem arises that a long time is necessary for development because of the thick film. The long development time leads to drawbacks such as a time-consuming process and low production efficiency.

With respect to the electrolytic plating bath used in solder bump formation, strong acid based solder plating baths, known as high-speed plating baths, are often utilized for enhancing production efficiency. When the pattern of chemically amplified resist composition is immersed in the strong acid based solder plating bath, the strong acid system exposes the pattern to very rigorous conditions, giving rise to the problems that not only cracks generate as mentioned previously, but also the pattern swells and deforms. The base resin commonly used in chemically amplified positive resist compositions is polyhydroxystyrene in which some phenolic hydroxyl groups are substituted with acetal groups as acid labile group (JP-A 2002-006503). When a pattern of the chemically amplified positive resist composition having such acid labile group is immersed in a strong acid based solder plating bath, the acid labile group can be eliminated by reaction with the acid in the plating bath. Thus the pattern is locally made hydrophilic and progressively swollen. As a result, the pattern is deformed within a short time.

Although the chemically amplified resist composition is preferred as the solder bump-forming resist material, many problems remain unsolved including a long development time, and film swell and pattern deformation upon immersion in plating bath.

Another exemplary chemically amplified resist composition used as the solder bump-forming resist material is disclosed in JP 4403627 as a composition comprising a base resin having an acid labile group other than acetal group, the composition having improved crack resistance. The resin used therein includes units which undergo elimination reaction with an acid and become soluble in alkaline developer, for example, (meth)acrylate units having 1,1-dimethyl-3-oxobutyl and/or 2-benzyl-propan-2-yl as the acid labile group. These acid labile groups have the following characteristics. Now that the solder bump-forming resist composition is formed into a thick film, if a compound resulting from acid elimination has a boiling point of up to 20° C. under atmospheric pressure, it can gasify, remain within the film, and form large bubbles in the film, adversely affecting the pattern profile. For this reason, preference is given to the acid labile group which is acid eliminated to form a compound having a boiling point of at least 20° C. under atmospheric pressure. Allegedly the compounds resulting from acid elimination of the acid labile groups in the units of exemplary base resins have the characteristics.

The acid labile groups mentioned above are tertiary alkyl esters. Under conditions of the step of immersing in a strong acid based solder plating bath, the tertiary alkyl esters do not undergo reaction with the acid in the plating bath, as opposed to the acetal groups. These acid labile groups are characterized by stability and a least likelihood of pattern deformation.

However, the chemically amplified resist composition comprising a resin having a tertiary alkyl ester as acid labile group may fail to gain a high resolution in the lithography process of forming a resist pattern because the acid elimination reaction of the acid labile group is inferior to that of acetal groups. This detracts from the removal of resist material to the bottom of a pattern being formed, resulting in a pattern profile being tapered.

When the acid labile group has characteristics as described in JP 4403627, that is, the acid labile group is able to be acid eliminated to form a component having a boiling point of at least 20° C. under atmospheric pressure, a possibility that the compound resulting from acid elimination in the resist pattern undergoes secondary addition reaction with the polymer or other resist components or reverse reaction to generate the acid labile group again cannot be completely removed. For this reason, the resist material film which is to become alkali soluble after exposure and development is extremely reduced in alkali solubility, failing to gain a high resolution. If the compound resulting from acid elimination has a high boiling point or a large or bulky molecule, the secondary addition reaction or reverse reaction as pointed out above can take place significantly. The resist material becomes insolubilized and left where spaces must be formed via positive/negative reversal, that is, as positive tone. Inversely a phenomenon to form a pattern there or a problem to induce scum formation can take place. Since the film formed of the solder bump-forming resist material is as thick as several tens of μm to about 100 μm, there is a tendency that the secondary addition reaction or reverse reaction as pointed out above takes place.

For the chemically amplified positive resist material used in the formation of solder bumps via a plating step, the selection of acid labile group is critical. It is critical to select an acid labile group which is stable against strong acid in the plating bath, which affords high reactivity with the acid generated by the acid generator so that acid elimination reaction may smoothly run, and thus displays a high resolution, and which does not detract from the high resolution performance since the elimination reaction does not entail secondary addition reaction or reverse reaction, when the relevant resist composition is subjected to the lithography pattern forming process.

When a chemically amplified resist material as exemplified above is used as a thick film of several tens of μm to about 100 μm in the formation of solder bumps, the problem of crack susceptibility is encountered again, which must be overcome. As means for preventing a chemically amplified resist film from cracking, for example, JP-A 2012-163950 proposes to add a polyvinyl ether copolymer to a high resolution chemically amplified resist composition. The vinyl ether moiety can react with a hydroxyl group in the resin in the resist composition. The reaction, if occurs, can adversely affect the dissolution of a resist film in alkaline aqueous solution. While there is a possibility for improvement in crack resistance, the otherwise expectable improvement in resolution can be impaired.

For the chemically amplified resist material in the form of a thick film of several tens of μm to about 100 μm used in the formation of solder bumps, not only the selection of acid labile group is critical, but the selection of an additive which is effective for crack prevention without sacrifice of resolution is also critical.

CITATION LIST

Patent Document 1: JP-A H10-207057
Patent Document 2: JP-B S46-16049
Patent Document 3: JP-A H06-202332
Patent Document 4: JP-A 2004-198915
Patent Document 5: JP-A 2002-006503
Patent Document 6: JP 4403627
Patent Document 7: JP-A 2012-163950

SUMMARY OF INVENTION

An object of the invention is to provide a chemically amplified positive resist composition which is useful as a thick film photoresist material subject to a subsequent plating step, which when lithographically processed to form a pattern, offers advantages including a high sensitivity, high resolution, vertical profile, and short development time, and in which the pattern exhibits crack resistance and is free of deformation during or after the plating step; and a pattern forming process.

In one aspect, the invention provides a chemically amplified positive resist composition comprising (A) an organic solvent, (B) a base resin, and (C) an acid generator. The base resin (B) comprises a first polymer comprising recurring units represented by the general formula (1) and having a weight average molecular weight of 1,000 to 500,000, and a second polymer comprising recurring units of acrylate or methacrylate represented by the general formula (2) and having a weight average molecular weight of 1,000 to 500,000.

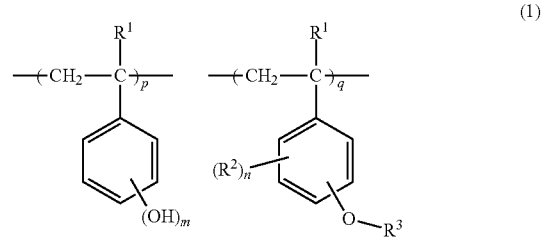

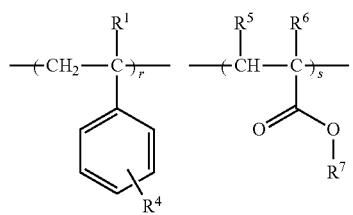

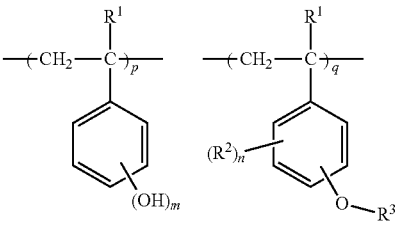

Herein $R^1$ is hydrogen, hydroxyl, straight alkyl, branched alkyl, halogen or trifluoromethyl, $R^2$ is hydrogen, hydroxyl, halogen or trifluoromethyl, $R^3$ is $C_4$-$C_{12}$ tertiary alkyl, $R^4$ is hydrogen, an optionally substituted alkyl group, optionally substituted alkoxy group, —$C(CF_3)_2$—OH, trialkylsiloxy group in which each alkyl moiety has 1 to 6 carbon atoms, $C_4$-$C_{20}$ oxoalkoxy group, tetrahydropyranyloxy group, tetrahydrofuranyloxy group, or trialkylsiloxy group, $R^5$ is hydrogen or methyl, $R^6$ is hydrogen, methyl, alkoxycarbonyl, cyano, halogen or trifluoromethyl, $R^7$ is $C_4$-$C_{30}$ alkyl, n is 0 or a positive integer of 1 to 4, m is 0 or a positive integer of 1 to 5, p, r and s each are 0 or a positive number, q is a positive number, and p+q+r+s=1.

wherein $R^1$, $R^2$, $R^3$, m, and n are as defined above, p and q are positive numbers, p+q=1,

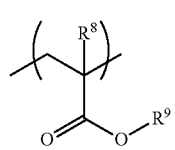

(2)

Herein $R^8$ is hydrogen or methyl, and $R^9$ is a straight, branched or cyclic $C_1$-$C_{24}$ alkyl group, or a $C_1$-$C_{24}$ monovalent organic group containing oxygen, sulfur or nitrogen.

In a preferred embodiment, $R^8$ in formula (2) is hydrogen.

In a preferred embodiment, $R^9$ in formula (2) is selected from the group consisting of a straight, branched or cyclic $C_1$-$C_{12}$ alkyl group, a $C_2$-$C_{12}$ alkoxyalkyl group, a $C_1$-$C_1$, hydroxyalkyl group, an organic group of the formula (3):

—(RO)$_n$—R'   (3)

wherein R is $C_2$-$C_4$ alkylene, R' is $C_1$-$C_6$ alkyl, and n is an integer of 1 to 6, and an organic group of the formula (4):

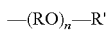  (4)

wherein R" is a straight, branched or cyclic $C_1$-$C_{12}$ alkyl group, a $C_2$-$C_{12}$ alkoxyalkyl group, a $C_1$-$C_{12}$ hydroxyalkyl group, or a $C_3$-$C_{12}$ (poly)alkylene glycol alkyl group.

In a preferred embodiment, the first polymer comprises recurring units of at least one type selected from the following formulae (5) to (7):

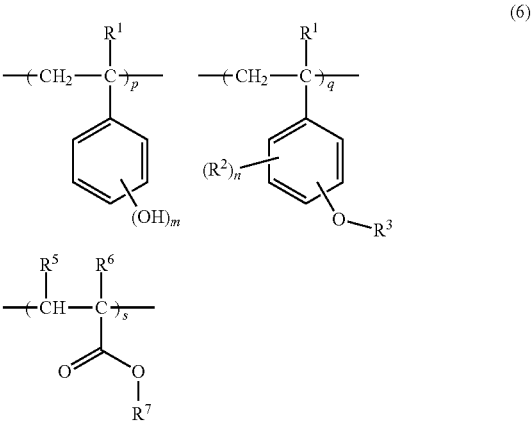

wherein $R^1$, $R^2$, $R^3$, $R^5$, $R^6$, $R^7$, m, and n are as defined above, p, q and s are positive numbers, p+q+s=1,

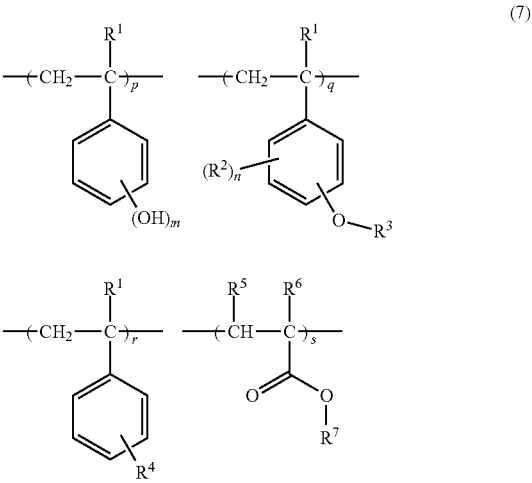

wherein $R^1$, $R^2$, $R^3$, $R^4$, $R^5$, $R^6$, $R^7$, m, and n are as defined above, p, q, r and s are positive numbers, p+q+r+s=1, In a preferred embodiment, the optionally substituted alkoxy group of $R^4$ is a group of the following formula (8), a group of the following formula (9), or a straight, branched or cyclic $C_4$-$C_{20}$ tertiary alkoxy group.

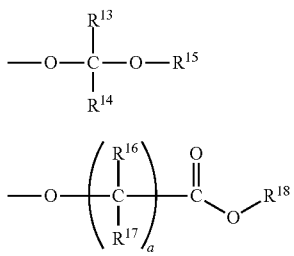
(8)

(9)

Herein $R^{13}$, $R^{14}$, $R^{15}$, $R^{16}$, and $R^{17}$ are each independently hydrogen, or a straight or branched $C_1$-$C_8$ alkyl group, a pair of $R^{13}$ and $R^{14}$, $R^{13}$ and $R^{15}$, or $R^{14}$ and $R^{15}$ may bond together to form a ring with the carbon atom or the carbon and oxygen atoms to which they are attached, each of $R^{13}$, $R^{14}$, and $R^{15}$ is a straight or branched $C_1$-$C_{18}$ alkylene group when they form a ring, $R^{18}$ is a straight, branched or cyclic $C_4$-$C_{40}$ alkyl group, and a is 0 or an integer of 1 to 4.

In a preferred embodiment, the first polymer comprises recurring units of the following formula (10):

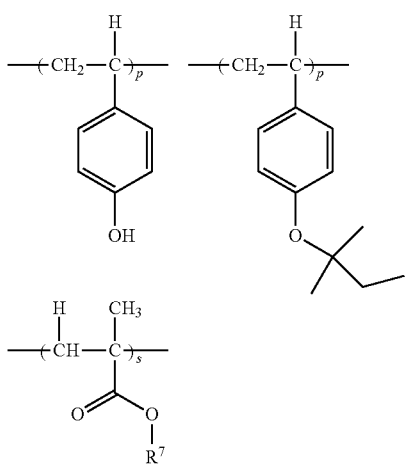
(10)

wherein $R^7$ is as defined above, p, q and s are positive numbers, p+q+s=1.

The resist composition may further comprise (D) a benzotriazole compound having the general formula (11) or (12).

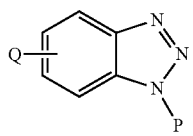
(11)

Herein P is hydrogen, hydroxyl, an optionally substituted $C_1$-$C_6$ alkyl, optionally substituted phenyl, substituent group having sulfonic acid or derivative thereof, or —Z—Y, Z is a $C_2$-$C_{12}$ alkylene, cycloalkylene or alkylene ether group which may be substituted with carboxyl, Y is a hydroxyl, $C_1$-$C_6$ alkoxy group, carboxyl group or dialkylamino group in which each alkyl moiety has 1 to 6 carbon atoms, Q is hydrogen, halogen, hydroxyl, $C_1$-$C_6$ alkyl, $C_1$-$C_6$ alkoxy group or an organic group having the formula (13):

(13)

wherein $R^{12}$ is hydrogen or $C_1$-$C_{12}$ alkyl, and x is 0 or 1.

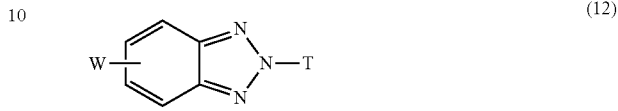
(12)

Herein T is hydrogen, hydroxyl, $C_1$-$C_6$ alkyl, or phenyl group, and W is hydrogen, halogen, hydroxyl, $C_1$-$C_6$ alkyl or $C_1$-$C_6$ alkoxy group.

In a preferred embodiment, the resist composition may further comprise (E) a dissolution inhibitor and (F) a basic compound, with the proviso that the benzotriazole compound of formula (11) or (12) is excluded from the basic compound.

In another aspect, the invention provides a pattern forming process comprising the steps of:

(i) coating the resist composition defined above onto a substrate and prebaking to form a resist film, (ii) exposing the resist film to UV radiation having a wavelength of up to 500 nm through a photomask, and (iii) optionally baking, and developing with a developer to form a resist pattern.

In a preferred embodiment, the substrate is a substrate having a conductive layer on its surface, and the process further comprises, after the developing step (iii), (iv) subjecting the resist pattern-bearing substrate to ashing with an oxygen plasma for thereby removing any resist residue on the pattern and rendering the resist film surface hydrophilic, (v) performing electroplating or electroless plating using the resist pattern as a mold, for thereby depositing a metal pattern on the conductive substrate to a predetermined thickness, and (vi) removing the resist component which has served as the mold for depositing the metal pattern, from the substrate.

Typically, the resist film has a thickness of 5 to 100 μm.

Advantageous Effects of Invention

The chemically amplified positive resist composition of the invention is coated onto a substrate to form a relatively thick resist film of 5 to 100 μm thick, which can be developed to form a pattern at a high sensitivity and a high degree of removal or dissolution to pattern bottom near the substrate. Even though the resist film is as thick as 5 to 100 μm, the development time is short. When electrolytic plating or electroless plating is carried out, after resist patterning, to deposit a metal plating layer on the pattern-bearing substrate, the resist pattern is fully resistant to a strong acid based plating bath and avoids crack generation.

BRIEF DESCRIPTION OF DRAWINGS

FIG. 1 illustrates resist patterns, depicting an area where cracks are observed.

DESCRIPTION OF EMBODIMENTS

The terms "a" and "an" herein do not denote a limitation of quantity, but rather denote the presence of at least one of the referenced item. "Optional" or "optionally" means that the subsequently described event or circumstance may or may not occur, and that the description includes instances where the event occurs and instances where it does not. As used herein, the notation ($C_n$-$C_m$) means a group containing from n to m carbon atoms per group. As employed herein, the terminology "(meth)acrylic" or "(meth)acrylate" is intended to mean "acrylic or methacrylic" or "acrylate or methacrylate."

The abbreviations and acronyms have the following meaning.

Mw: weight average molecular weight
Mn: number average molecular weight
Mw/Mn: molecular weight distribution or dispersity
GPC: gel permeation chromatography
PEB: post-exposure baking One embodiment of the invention is a chemically amplified positive resist composition comprising (A) an organic solvent, (B) a base resin, and (C) an acid generator. The base resin (B) is a blend of a first polymer comprising recurring units represented by the general formula (1) defined below and having a weight average molecular weight of 1,000 to 500,000 and a second polymer comprising recurring units of (meth)acrylate represented by the general formula (2) defined below and having a weight average molecular weight of 1,000 to 500,000.

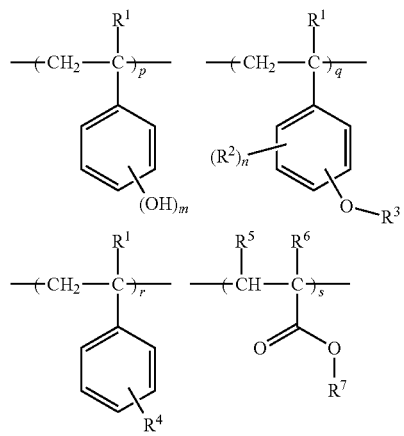
(1)

Herein $R^1$ is hydrogen, hydroxyl, straight $C_1$-$C_6$ alkyl, branched $C_3$-$C_6$ alkyl, halogen or trifluoromethyl, $R^2$ is hydrogen, hydroxyl, halogen or trifluoromethyl, $R^3$ is $C_4$-$C_{12}$ tertiary alkyl, $R^4$ is hydrogen, an optionally fluoro-substituted $C_1$-$C_{12}$ alkyl group, optionally fluoro-substituted $C_1$-$C_{12}$ alkoxy group, —C(CF$_3$)$_2$—OH, trialkylsiloxy group in which each alkyl moiety has 1 to 6 carbon atoms, $C_4$-$C_{20}$ oxoalkoxy group, tetrahydropyranyloxy group, tetrahydrofuranyloxy group, or trialkylsiloxy group, $R^5$ is hydrogen or methyl, $R^6$ is hydrogen, methyl, alkoxycarbonyl, cyano, halogen or trifluoromethyl, $R^7$ is $C_4$-$C_{30}$ alkyl, n is 0 or a positive integer of 1 to 4, m is 0 or a positive integer of 1 to 5, p, r and s each are 0 or a positive number, and q is a positive number.

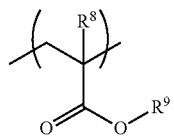
(2)

Herein $R^8$ is hydrogen or methyl, and $R^9$ is a straight, branched or cyclic $C_1$-$C_{24}$ alkyl group, or a $C_1$-$C_{24}$ monovalent organic group containing oxygen, sulfur or nitrogen.

When the optionally substituted alkoxy group represented by $R^4$ has an acid labile group function, it is selected from a variety of such groups, preferably from a group of the following formula (8), a group of the following formula (9), and a straight, branched or cyclic $C_4$-$C_{20}$ tertiary alkoxy group. When $R^4$ is a tertiary alkoxy group, it is an alkoxy group excluding the tertiary alkyl group selected for W.

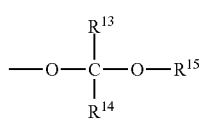
(8)

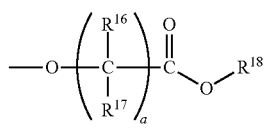
(9)

Herein $R^{13}$, $R^{14}$, $R^{15}$, $R^{16}$, and $R^{17}$ are each independently hydrogen, or a straight or branched $C_1$-$C_8$ alkyl group, a pair of $R^{13}$ and $R^{14}$, $R^{13}$ and $R^{15}$, or $R^{14}$ and $R^{15}$ may bond together to form a ring with the carbon atom or the carbon and oxygen atoms to which they are attached, each participant of $R^{13}$, $R^{14}$, and $R^{15}$ is a straight or branched $C_1$-$C_{18}$ alkylene group when they form a ring, $R^{18}$ is a straight, branched or cyclic $C_4$-$C_{40}$ alkyl group, and a is 0 or an integer of 1 to 4.

Suitable acid labile groups of formula (8) include methoxyethyl, ethoxyethyl, n-propoxyethyl, isopropoxyethyl, n-butoxyethyl, isobutoxyethyl, tert-butoxyethyl, cyclohexyloxyethyl, methoxypropyl, ethoxypropyl, 1-methoxy-1-methylethyl, and 1-ethoxy-1-methylethyl, to be bonded to the phenyl group via the oxygen atom. Suitable acid labile groups of formula (9) include tert-butoxycarbonyl, tert-butoxycarbonylmethyl, ethylcyclopentyloxycarbonyl, ethylcyclohexyloxycarbonyl, and methylcyclopentyloxycarbonyl, to be bonded to the phenyl group via the oxygen atom. Suitable trialkylsilyl groups include those in which each alkyl moiety has 1 to 6 carbon atoms.

In formula (1), $R^1$, $R^2$, $R^3$ and $R^6$ may be halogen. Exemplary halogens are fluorine, chlorine and bromine.

$R^7$ is an alkyl group which may be tertiary alkyl. Tertiary alkyl may be selected from optionally substituted alkyl groups of 4 to 30 carbon atoms, preferably those of the general formulae (14) and (15).

(14)

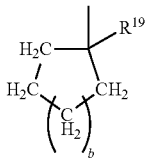

Herein $R^{19}$ is methyl, ethyl, isopropyl, cyclohexyl, cyclopentyl, vinyl, acetyl, phenyl, benzyl or cyano, and b is an integer of 0 to 3.

The cyclic alkyl groups of formula (14) are preferably 5- or 6-membered rings. Examples include 1-methylcyclopentyl, 1-ethylcyclopentyl, 1-isopropylcyclopentyl, 1-vinylcyclopentyl, 1-acetylcyclopentyl, 1-phenylcyclopentyl, 1-cyanocyclopentyl, 1-methylcyclohexyl, 1-ethylcyclohexyl, 1-isopropylcyclohexyl, 1-vinylcyclohexyl, 1-acetylcyclohexyl, 1-phenylcyclohexyl, and 1-cyanocyclohexyl.

(15)

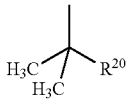

Herein $R^{20}$ is methyl, ethyl, isopropyl, cyclohexyl, cyclopentyl, vinyl, phenyl, benzyl or cyano.

Examples of the group of formula (15) include t-butyl, 1-vinyldimethylmethyl, 1-benzyldimethylmethyl, 1-phenyldimethylmethyl, and 1-cyanodimethylmethyl.

An alkyl group forming a tertiary ester as shown below is also preferred as $R^7$.

(16)-1

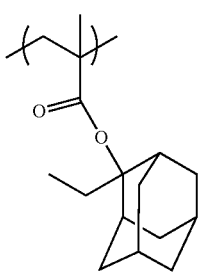

(16)-2

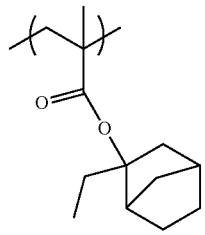

(16)-3

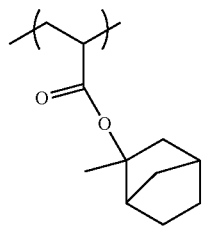

(16)-4

In formula (1), p, r and s each are 0 or a positive number, and q is a positive number. With properties of resist material taken into account, these subscripts preferably satisfy the following range: $0<q/(p+q+r+s)\leq 0.5$, more preferably $0<q/(p+q+r+s)\leq 0.3$, $0\leq p/(p+q+r+s)\leq 0.8$, more preferably $0.3\leq p/(p+q+r+s)\leq 0.8$, $0\leq r/(p+q+r+s)\leq 0.35$, with the proviso that $r>0$ when the polymer consists of four components, $0\leq s/(p+q+r+s)\leq 0.35$, more preferably $0<s/(p+q+r+s)\leq 0.3$, provided $p+q+r+s=1$.

In case $q=0$, indicating that a polymer of formula (1) does not contain the relevant unit (q), a contrast of alkali dissolution rate is lost, and resolution is worsened. If a proportion of p is too high, the unexposed region of film may have too high an alkali dissolution rate. By properly selecting the values of p, q, r and s within the above ranges, the size and profile of a pattern can be controlled as desired.

In order that the chemically amplified positive resist composition have a high sensitivity and be able to reduce the development time, it is preferred that s in formula (1) be not equal to 0. In a case where a phenolic hydroxyl group is protected with an acid labile group, the alkali soluble functional group resulting from elimination of that acid labile group is the phenolic hydroxyl group. On the other hand, the substituent group $R^7$ in recurring unit (s) is a tertiary alkyl group which is an acid labile group, and the alkali soluble functional group resulting from elimination of $R^7$ is —COOH group. When the dissolution rate of phenolic hydroxyl group and —COOH group in alkaline developer is compared, the dissolution rate of —COOH group is overwhelmingly high. Then the chemically amplified positive resist composition comprising a base resin containing recurring units (s) has a high sensitivity and is able to reduce the development time.

The polymer of formula (1) should have a weight average molecular weight (Mw) of 1,000 to 500,000, preferably 2,000 to 300,000, as measured by GPC versus polystyrene standards. With too low a Mw, the resist composition is less heat resistant. With too high a Mw, the resist composition is reduced in alkali dissolution and tends to a footing phenomenon after pattern formation.

Any polymer comprising recurring units of formula (1) may be used as the base resin as long as it has the polymer structure of formula (1). Inter alia, polymer structures of two, three and four components as shown below are preferred.

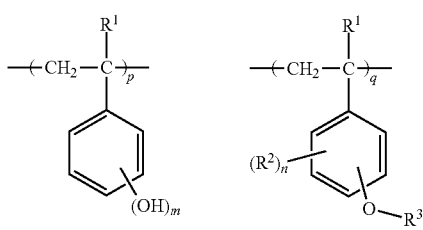
(5)

Herein $R^1$, $R^2$, $R^3$, m, and n are as defined above. In formula (5), p and q are positive numbers, and p+q=1, preferably $0.5 \leq p \leq 0.8$ and $0.2 \leq q \leq 0.5$.

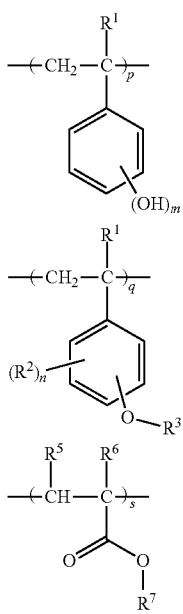
(6)

Herein $R^1$, $R^2$, $R^3$, $R^5$, $R^6$, $R^7$, m, and n are as defined above. In formula (6), p, q and s are positive numbers, and p+q+s=1, preferably $0.15 \leq p \leq 0.8$, $0 < q \leq 0.5$, and $0 < s \leq 0.35$, more preferably $0.4 \leq p \leq 0.8$, $0 < q \leq 0.3$, and $0 < s \leq 0.3$.

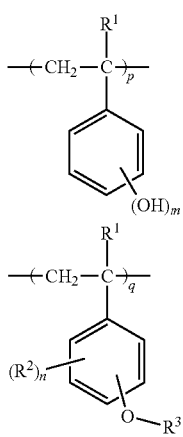
(7)

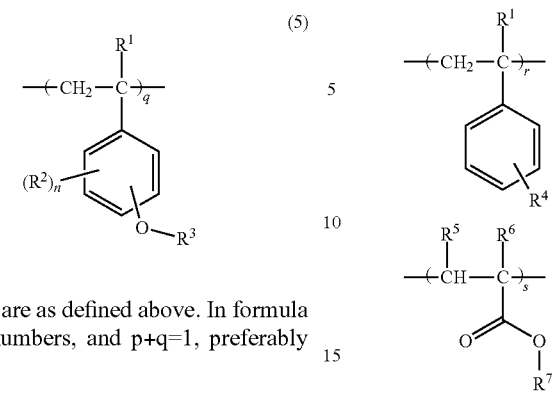

Herein $R^1$, $R^2$, $R^3$, $R^4$, $R^5$, $R^6$, $R^7$, m, and n are as defined above. In formula (7), p, q, r and s are positive numbers, and p+q+r+s=1, preferably $0 < p \leq 0.8$, $0 < q \leq 0.5$, $0 < r \leq 0.35$, and $0 < s \leq 0.35$, more preferably $0.2 \leq p \leq 0.8$, $0 < q \leq 0.3$, $0 < r \leq 0.3$, and $0 < s \leq 0.3$.

Further a polymer comprising recurring units of the general formula (10) and having a Mw of 5,000 to 100,000 is preferred. A polymer comprising recurring units of the general formula (10a) is more preferred.

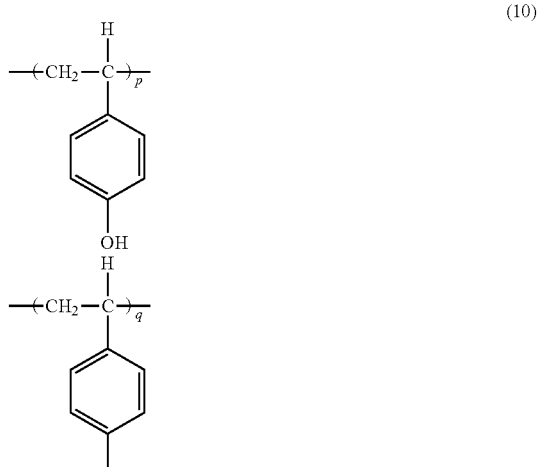
(10)

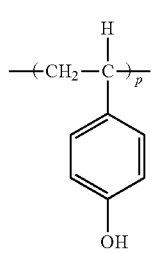
(10a)

-continued

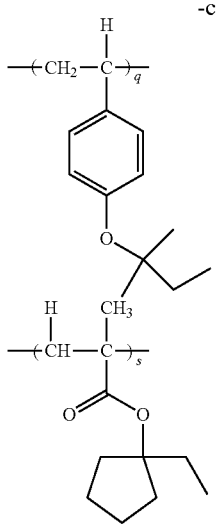

Herein $R^7$, p, q and s are as defined for formula (6).

If a multi-component polymer has a broad molecular weight distribution or dispersity (Mw/Mn), which indicates the presence of lower and higher molecular weight polymer fractions, there is a possibility that following exposure, foreign matter is left on the pattern or the pattern profile is exacerbated. The influences of molecular weight and dispersity become stronger as the pattern rule becomes finer. Therefore, the multi-component copolymer of formula (1) should preferably have a narrow dispersity (Mw/Mn) of 1.0 to 2.0, especially 1.0 to 1.5, in order to provide a resist composition suitable for micropatterning to a small feature size.

The polymer of formula (1) may be synthesized by any desired method, for example, by dissolving acetoxystyrene, (meth)acrylic acid tertiary ester, and amyloxystyrene monomers in an organic solvent, adding a radical initiator thereto, and effecting heat polymerization. The resulting polymer is subjected to alkaline hydrolysis in an organic solvent, whereby the acetoxy group is deprotected, obtaining a ternary copolymer or a polymer of three components: hydroxystyrene, (meth)acrylic acid tertiary ester, and amyloxystyrene. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours. For alkaline hydrolysis, ammonia water, triethylamine or the like may be used as the base, the reaction temperature may be −20° C. to 100° C., preferably 0° C. to 60° C., and the reaction time may be 0.2 to 100 hours, preferably 0.5 to 20 hours.

After the resulting polymer having a phenolic hydroxyl group is isolated, an acid labile group, for example, an acid labile group of formula (8) or (9) may be introduced into the phenolic hydroxyl group. For example, the polymer having a phenolic hydroxyl group may be reacted with a halogenated alkyl ether compound in the presence of a base, thereby obtaining a polymer in which the phenolic hydroxyl group is, in part, protected with an alkoxyalkyl group.

In the protection step, the reaction medium is preferably an aprotic polar solvent such as acetonitrile, acetone, dimethylformamide, dimethylacetamide, tetrahydrofuran or dimethyl sulfoxide, which may be used alone or in admixture. Preferred examples of the base include triethylamine, pyridine, diisopropylamine, and potassium carbonate. The base is preferably used in an amount of at least 10 mol % based on the moles of total phenolic hydroxyl groups on the polymer to be reacted. The reaction temperature may be −50° C. to 100° C., preferably 0° C. to 60° C., and the reaction time may be 0.5 to 100 hours, preferably 1 to 20 hours.

The introduction of an acid labile group of formula (9) is possible with an alternative method, that is, by reacting the polymer with a dialkyl dicarbonate or alkoxycarbonylalkyl halide in a solvent in the presence of a base. Examples of the dialkyl dicarbonate include di-tert-butyl dicarbonate and di-tert-amyl dicarbonate. Examples of the alkoxycarbonylalkyl halide include tert-butoxycarbonylmethyl chloride, tert-amyloxycarbonylmethyl chloride, tert-butoxycarbonylmethyl bromide, and tert-butoxycarbonylethyl chloride. The reaction medium is preferably an aprotic polar solvent such as acetonitrile, acetone, dimethylformamide, dimethylacetamide, tetrahydrofuran or dimethyl sulfoxide, which may be used alone or in admixture. Preferred examples of the base include triethylamine, pyridine, imidazole, diisopropylamine, and potassium carbonate. The base is preferably used in an amount of at least 10 mol % based on the moles of total phenolic hydroxyl groups on the polymer to be reacted. The reaction temperature may be 0° C. to 100° C., preferably 0° C. to 60° C., and the reaction time may be 0.2 to 100 hours, preferably 1 to 10 hours.

Notably, the synthesis method of the polymer is not limited to the foregoing.

In combination with the first polymer, a second polymer is used as the base resin. The second polymer is a polymer comprising recurring units of acrylate or methacrylate represented by the general formula (2) and having a weight average molecular weight of 1,000 to 500,000.

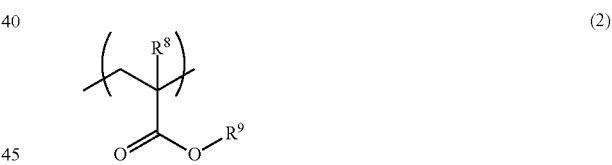

(2)

Herein $R^8$ is hydrogen or methyl, and $R^9$ is a straight, branched or cyclic $C_1$-$C_{24}$ alkyl group, or a $C_1$-$C_{24}$ monovalent organic group containing oxygen, sulfur or nitrogen.

In formula (2), $R^8$ is hydrogen or methyl, which means that the polymer is a polyacrylate or polymethacrylate type polymer. Inter alia, the polyacrylate type polymer of formula (2) wherein $R^8$ is hydrogen is preferred for the purpose of improving the crack resistance of the chemically amplified positive resist composition during the plating step.

$R^9$ is preferably a straight, branched or cyclic $C_1$-$C_{12}$ alkyl group, or a $C_1$-$C_{14}$ monovalent organic group containing oxygen, sulfur or nitrogen. Suitable straight, branched or cyclic $C_1$-$C_{12}$ alkyl groups include methyl, ethyl, n-propyl, isopropyl, n-butyl, isobutyl, tert-butyl, n-pentyl, n-hexyl, n-heptyl, n-octyl, 2-ethylhexyl, cyclopentyl, cyclohexyl, and cycloheptyl. Suitable $C_1$-$C_{12}$ monovalent organic groups containing oxygen, sulfur or nitrogen include $C_2$-$C_{12}$ alkoxyalkyl groups, $C_1$-$C_{12}$ hydroxyalkyl groups, organic groups of the formula (3):

—(RO)$_n$—R'   (3)

wherein R is $C_2$-$C_4$ alkylene, R' is $C_1$-$C_6$ alkyl, and n is an integer of 1 to 6, and organic groups of the formula (4):

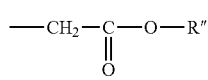

(4)

wherein R" is a straight, branched or cyclic $C_1$-$C_{12}$ alkyl group, a $C_2$-$C_{12}$ alkoxyalkyl group, a $C_1$-$C_{12}$ hydroxyalkyl group, or a $C_3$-$C_{12}$ (poly)alkylene glycol alkyl group. Examples include 2-methoxyethyl, 2-ethoxyethyl, 3-methoxybutyl, 2-hydroxyethyl, 2-hydroxypropyl, 2-hydroxy-1-methylethyl, —$(CH_2CH_2O)_3CH_3$, —$(CH_2CH_2O)_3C_2H_5$, —$(CH_2CH_2O)CH_3$, —$(CH_2CH_2O)C_2H_5$, —$(CH_2CH_2O)_3CH_3$, —$(CH(CH_3)CH_2O)$ $CH_3$, —$(CH(CH_3)CH_2O)C_2H_5$, and —$(CH(CH_3)CH_2O)$-n-$C_4H_9$.

The poly(meth)acrylate type polymer of formula (2) should have a weight average molecular weight (Mw) of 1,000 to 500,000, preferably 1,000 to 20,000, as measured by GPC versus polystyrene standards. A polymer with a Mw in excess of 500,000 is less compatible with the first polymer or less soluble in organic solvents. Also scum may be observed after development for patterning, or resolution and sensitivity may be degraded. A polymer with too low a Mw may fail to provide crack resistance during and after the plating step.

The poly(meth)acrylate type polymer of formula (2) (simply second polymer) is blended with the first polymer of formula (1). Preferably 2 to 30 parts, more preferably 5 to 20 parts by weight of the second polymer is blended with 100 parts by weight of the first polymer. A resist film of a polymer blend containing less than 2 parts of the second polymer may not withstand the stress associated with metal growth during the plating step after thick film resist pattern formation, allowing the pattern to crack. More than 30 parts of the second polymer may invite a risk of scum generation after development.

On use of the positive resist material, the base resin (B) is dissolved in the organic solvent (A) to form a solution. Any organic solvents may be used as long as they have a sufficient solubility to the base resin and ensure effective coating. Suitable organic solvents include cellosolve solvents such as methyl cellosolve, ethyl cellosolve, methyl cellosolve acetate, and ethyl cellosolve acetate; propylene glycol solvents such as propylene glycol monomethyl ether, propylene glycol monobutyl ether, propylene glycol monomethyl ether acetate, propylene glycol dimethyl ether, and propylene glycol monoethyl ether acetate; ester solvents such as butyl acetate, amyl acetate, methyl lactate, ethyl lactate, ethyl 3-methoxypropionate, and ethyl 3-ethoxypropionate; alcohol solvents such as hexanol and diacetone alcohol; ketone solvents such as cyclohexanone and methyl amyl ketone; ether solvents such as methyl phenyl ether and diethylene glycol dimethyl ether; highly polar solvents such as N,N-dimethylformamide and N-methylpyrrolidone, and mixtures thereof.

An amount of the solvent used is desirably 1 to 20 times, more desirably 1 to 15 times the amount of total solids (including the base resin) on a weight basis.

The PAG (C) may be any compound capable of generating an acid upon exposure to high-energy radiation. Suitable PAGs include sulfonium salt, iodonium salt, sulfonyldiazomethane, and N-sulfonyloxyimide acid generators. Exemplary acid generators are given below while they may be used alone or in admixture of two or more.

Sulfonium salts are salts of sulfonium cations with sulfonates. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl(2-naphthyl)sulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, and tribenzylsulfonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, toluenesulfonate, benzenesulfonate, 4-(4-toluenesulfonyloxyl)benzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodonium salts are salts of iodonium cations with sulfonates. Exemplary iodonium cations include aryl iodonium cations such as diphenyliodonium, bis(4-tert-butylphenyl)iodonium, 4-tert-butoxyphenylphenyliodonium, and 4-methoxyphenylphenyliodonium.

Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, toluenesulfonate, benzenesulfonate, 4-(4-toluenesulfonyloxyl)benzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bissulfonyldiazomethane compounds and sulfonyl-carbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates.

Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Benzoinsulfonate photoacid generators include benzoin tosylate, benzoin mesylate, and benzoin butanesulfonate.

Pyrogallol trisulfonate photoacid generators include pyrogallol, phloroglucinol, catechol, resorcinol, and hydroquinone, in which all hydroxyl groups are substituted with trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, or methanesulfonate.

Nitrobenzyl sulfonate photoacid generators include 2,4-dinitrobenzyl sulfonates, 2-nitrobenzyl sulfonates, and 2,6-dinitrobenzyl sulfonates, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is substituted by trifluoromethyl.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Suitable O-arylsulfonyloxime compounds and O-alkylsulfonyloxime compounds (oxime sulfonates) include photoacid generators in the form of glyoxime derivatives; photoacid generators in the form of oxime sulfonates with a long conjugated system separated by thiophene or cyclohexadiene; oxime sulfonates having an electron withdrawing group such as trifluoromethyl incorporated for increased stability; oxime sulfonates using phenylacetonitrile or substituted acetonitrile derivatives; and bisoxime sulfonates.

Photoacid generators in the form of glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedionedioxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(methanesulfonyl)-α-dimethylglyoxime, bis-O-(trifluoromethanesulfonyl)-α-dimethylglyoxime, bis-O-(2,2,2-trifluoroethanesulfonyl)-α-dimethylglyoxime, bis-O-(10-camphorsulfonyl)-α-dimethylglyoxime, bis-O-(benzenesulfonyl)-α-dimethylglyoxime, bis-O-(4-fluorobenzenesulfonyl)-α-dimethylglyoxime, bis-O-(4-trifluoromethylbenzenesulfonyl)-α-dimethylglyoxime, bis-O-(xylenesulfonyl)-α-dimethylglyoxime, bis-O-(trifluoromethanesulfonyl)-nioxime, bis-O-(2,2,2-trifluoroethanesulfonyl)-nioxime, bis-O-(10-camphorsulfonyl)-nioxime, bis-O-(benzenesulfonyl)-nioxime, bis-O-(4-fluorobenzenesulfonyl)-nioxime, bis-O-(4-(trifluoromethyl)benzenesulfonyl)-nioxime, and bis-O-(xylenesulfonyl)-nioxime. Also included are modified forms of the foregoing compounds having substituted on their skeleton 2-benzoyloxy-1,1,3,3,3-pentafluoropropanesulfonate, 1,1,3,3,3-pentafluoro-2-(4-phenylbenzoyloxyl)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yl-oxycarbonyl)difluoromethanesulfonate, and 4-oxo-1-adamantyloxycarbonyldifluoromethanesulfonate.

Photoacid generators in the form of oxime sulfonates with a long conjugated system separated by thiophene or cyclohexadiene include
(5-(p-toluenesulfonyl)oxyimino-5H-thiophen-2-ylidene)-phenylacetonitrile,
(5-(10-camphorsulfonyl)oxyimino-5H-thiophen-2-ylidene)-phenylacetonitrile,
(5-n-octanesulfonyloxyimino-5H-thiophen-2-ylidene)-phenylacetonitrile,
(5-(p-toluenesulfonyl)oxyimino-5H-thiophen-2-ylidene)-(2-methylphenyl)acetonitrile,
(5-(10-camphorsulfonyl)oxyimino-5H-thiophen-2-ylidene)-(2-methylphenyl)acetonitrile,
(5-n-octanesulfonyloxyimino-5H-thiophen-2-ylidene)-(2-methylphenyl)acetonitrile,
(5-(4-(p-toluenesulfonyloxy)benzenesulfonyl)oxyimino-5H-thiophen-2-ylidene)phenylacetonitrile, and
(5-(2,5-bis(p-toluenesulfonyloxy)benzenesulfonyl)oxyimino-5H-thiophen-2-ylidene)phenylacetonitrile.

Also included are modified forms of the foregoing compounds having substituted on their skeleton
2-benzoyloxy-1,1,3,3,3-pentafluoropropanesulfonate, 1,1,3,3,3-pentafluoro-2-(4-phenylbenzoyloxyl)propanesulfonate, 1,1,3,3,3-pentafluoro-2-pivaloyloxypropanesulfonate, 2-cyclohexanecarbonyloxy-1,1,3,3,3-pentafluoropropanesulfonate,
1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate,
2-(1-adamantanecarbonyloxy)-1,1,3,3,3-pentafluoropropanesulfonate,
2-acetyloxy-1,1,3,3,3-pentafluoropropanesulfonate,
1,1,3,3,3-pentafluoro-2-hydroxypropanesulfonate,
1,1,3,3,3-pentafluoro-2-tosyloxypropanesulfonate,
1,1-difluoro-2-tosyloxyethanesulfonate, adamantanemethoxycarbonyldifluoromethanesulfonate,
1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yl-oxycarbonyl)difluoromethanesulfonate, and
4-oxo-1-adamantyloxycarbonyldifluoromethanesulfonate.

Suitable oxime sulfonates having an electron withdrawing group such as trifluoromethyl incorporated for increased stability include
2,2,2-trifluoro-1-phenyl-ethanone O-(methylsulfonyl)oxime,
2,2,2-trifluoro-1-phenyl-ethanone O-(10-camphorsulfonyl)oxime,
2,2,2-trifluoro-1-phenylethanone O-(4-methoxybenzenesulfonyl)oxime,
2,2,2-trifluoro-1-phenylethanone O-(1-naphthylsulfonyl)oxime,
2,2,2-trifluoro-1-phenylethanone O-(2-naphthylsulfonyl)oxime,
2,2,2-trifluoro-1-phenylethanone O-(2,4,6-trimethylphenylsulfonyl)oxime,
2,2,2-trifluoro-1-(4-methylphenyl)ethanone O-(10-camphorsulfonyl)oxime,
2,2,2-trifluoro-1-(4-methylphenyl)ethanone O-(methylsulfonyl)oxime,
2,2,2-trifluoro-1-(2-methylphenyl)ethanone O-(10-camphorsulfonyl)oxime,
2,2,2-trifluoro-1-(2,4-dimethylphenyl)ethanone O-(10-camphorsulfonyl)oxime,
2,2,2-trifluoro-1-(2,4-dimethylphenyl)ethanone O-(1-naphthylsulfonyl)oxime,
2,2,2-trifluoro-1-(2,4-dimethylphenyl)ethanone O-(2-naphthylsulfonyl)oxime,
2,2,2-trifluoro-1-(2,4,6-trimethylphenyl)ethanone O-(10-camphorsulfonyl)oxime,
2,2,2-trifluoro-1-(2,4,6-trimethylphenyl)ethanone O-(1-naphthylsulfonyl)oxime,
2,2,2-trifluoro-1-(2,4,6-trimethylphenyl)ethanone O-(2-naphthylsulfonyl)oxime,
2,2,2-trifluoro-1-(4-methoxyphenyl)ethanone O-(methylsulfonyl)oxime,
2,2,2-trifluoro-1-(4-methylthiophenyl)ethanone O-(methylsulfonyl)oxime,
2,2,2-trifluoro-1-(3,4-dimethoxyphenyl)ethanone O-(methylsulfonyl)oxime,
2,2,2-trifluoro-1-(4-methoxyphenyl)ethanone O-(4-methylphenylsulfonyl)oxime,
2,2,2-trifluoro-1-(4-methoxyphenyl)ethanone O-(4-methoxyphenylsulfonyl)oxime,
2,2,2-trifluoro-1-(4-methoxyphenyl)ethanone O-(4-dodecylphenylsulfonyl)oxime,
2,2,2-trifluoro-1-(4-methoxyphenyl)ethanone O-(octylsulfonyl)oxime,
2,2,2-trifluoro-1-(4-thiomethylphenyl)ethanone O-(4-methoxyphenylsulfonyl)oxime,
2,2,2-trifluoro-1-(4-thiomethylphenyl)ethanone O-(4-dodecylphenylsulfonyl)oxime,
2,2,2-trifluoro-1-(4-thiomethylphenyl)ethanone O-(octylsulfonyl)oxime,
2,2,2-trifluoro-1-(4-thiomethylphenyl)ethanone O-(2-naphthylsulfonyl)oxime,
2,2,2-trifluoro-1-(2-methylphenyl)ethanone O-(methylsulfonyl)oxime,
2,2,2-trifluoro-1-(4-methylphenyl)ethanone O-(phenylsulfonyl)oxime,
2,2,2-trifluoro-1-(4-chlorophenyl)ethanone O-(phenylsulfonyl)oxime,
2,2,3,3,4,4,4-heptafluoro-1-phenylbutanone O-(10-camphorsulfonyl)oxime,
2,2,2-trifluoro-1-(1-naphthyl)ethanone O-(methylsulfonyl)oxime,
2,2,2-trifluoro-1-(2-naphthyl)ethanone O-(methylsulfonyl)oxime,
2,2,2-trifluoro-1-(4-benzylphenyl)ethanone O-(methylsulfonyl)oxime,
2,2,2-trifluoro-1-(4-(phenyl-1,4-dioxa-but-1-yl)phenyl)ethanone O-(methylsulfonyl)oxime,
2,2,2-trifluoro-1-(1-naphthyl)ethanone O-(propylsulfonyl)oxime,
2,2,2-trifluoro-1-(2-naphthyl)ethanone O-(propylsulfonyl)oxime,
2,2,2-trifluoro-1-(4-benzylphenyl)ethanone O-(propylsulfonyl)oxime,
2,2,2-trifluoro-1-(4-methylsulfonylphenyl)ethanone O-(propylsulfonyl)oxime,
2,2,2-trifluoro-1-(4-methylsulfonyloxyphenyl)ethanone O-(propylsulfonyl)oxime,
2,2,2-trifluoro-1-(4-methylcarbonyloxyphenyl)ethanone O-(propylsulfonyl)oxime,
2,2,2-trifluoro-1-(6H,7H-5,8-dioxonaphth-2-yl)ethanone O-(propylsulfonyl)oxime,
2,2,2-trifluoro-1-(4-methoxycarbonylmethoxyphenyl)ethanone O-(propylsulfonyl)oxime,
2,2,2-trifluoro-1-(4-methoxycarbonyl)-(4-amino-1-oxa-pent-1-yl)phenyl)ethanone O-(propylsulfonyl)oxime,
2,2,2-trifluoro-1-(3,5-dimethyl-4-ethoxyphenyl)ethanone O-(propylsulfonyl)oxime,
2,2,2-trifluoro-1-(4-benzyloxyphenyl)ethanone O-(propylsulfonyl)oxime,
2,2,2-trifluoro-1-(2-thiophenyl)ethanone O-(propylsulfonate)oxime, and
2,2,2-trifluoro-1-(1-dioxathiophen-2-yl)ethanone O-(propylsulfonate)oxime;
2,2,2-trifluoro-1-(4-(3-(4-(2,2,2-trifluoro-1-(trifluoro-methanesulfonyloxyimino)ethyl)phenoxy)propoxy)phenyl)ethanone O-(trifluoromethanesulfonyl)oxime,
2,2,2-trifluoro-1-(4-(3-(4-(2,2,2-trifluoro-1-(1-propane-sulfonyloxyimino)ethyl)phenoxy)propoxy)phenyl)ethanone O-(propylsulfonyl)oxime,
2,2,2-trifluoro-1-(4-(3-(4-(2,2,2-trifluoro-1-(1-butane-sulfonyloxyimino)ethyl)phenoxy)propoxy)phenyl)ethanone O-(butylsulfonyl)oxime,
2,2,2-trifluoro-1-(4-(3-(4-(2,2,2-trifluoro-1-(4-(4-methylphenylsulfonyloxy)phenylsulfonyloxyimino)ethyl)phenoxy)-propoxy)phenyl)ethanone O-(4-(4-methylphenylsulfonyloxy)-phenylsulfonyl)oxime, and
2,2,2-trifluoro-1-(4-(3-(4-(2,2,2-trifluoro-1-(2,5-bis(4-methylphenylsulfonyloxy)benzenesulfonyloxy)phenyl-sulfonyloxy-imino)ethyl)phenoxy)propoxy)phenyl)ethanone O-(2,5-bis(4-methylphenylsulfonyloxy)benzenesulfonyloxy)phenylsulfonyl)oxime.

Also included are modified forms of the foregoing compounds having substituted on their skeleton
2-benzoyloxy-1,1,3,3,3-pentafluoropropanesulfonate,
1,1,3,3,3-pentafluoro-2-(4-phenylbenzoyloxyl)propanesulfonate,
1,1,3,3,3-pentafluoro-2-pivaloyloxypropanesulfonate,
2-cyclohexanecarbonyloxy-1,1,3,3,3-pentafluoropropanesulfonate,
1,1,3,3,3-pentafluoro-2-furoyloxypropanesulfonate,
2-naphthoyloxy-1,1,3,3,3-pentafluoropropanesulfonate,
2-(4-tert-butylbenzoyloxy)-1,1,3,3,3-pentafluoropropanesulfonate,
2-(1-adamantanecarbonyloxy)-1,1,3,3,3-pentafluoropropanesulfonate,
2-acetyloxy-1,1,3,3,3-pentafluoropropanesulfonate, 1,1,3,3,3-pentafluoro-2-hydroxypropanesulfonate,
1,1,3,3,3-pentafluoro-2-tosyloxypropanesulfonate,
1,1-difluoro-2-tosyloxyethanesulfonate, adamantanemethoxycarbonyldifluoromethanesulfonate,
1-(3-hydroxymethyladamantane)methoxycarbonyldifluoromethanesulfonate, methoxycarbonyldifluoromethanesulfonate,
1-(hexahydro-2-oxo-3,5-methano-2H-cyclopenta[b]furan-6-yl-oxycarbonyl)difluoromethanesulfonate, and
4-oxo-1-adamantyloxycarbonyldifluoromethanesulfonate.

Also included are oxime sulfonates having the formula (Ox-1):

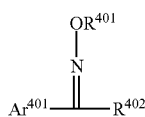

(Ox-1)

wherein $R^{401}$ is a substituted or unsubstituted $C_1$-$C_{10}$ haloalkylsulfonyl or halobenzenesulfonyl group, $R^{402}$ is a $C_1$-$C_{11}$ haloalkyl group, and $Ar^{401}$ is substituted or unsubstituted aromatic or hetero-aromatic group.

Examples include
2-[2,2,3,3,4,4,5,5-octafluoro-1-(nonafluorobutylsulfonyl-oxyimino)-pentyl]fluorene,
2-[2,2,3,3,4,4-pentafluoro-1-(nonafluorobutylsulfonyl-oxyimino)-butyl]fluorene,
2-[2,2,3,3,4,4,5,5,6,6-decafluoro-1-(nonafluorobutylsulfonyl-oxyimino)-hexyl]fluorene,
2-[2,2,3,3,4,4,5,5-octafluoro-1-(nonafluorobutylsulfonyl-oxyimino)-pentyl]-4-biphenyl,
2-[2,2,3,3,4,4-pentafluoro-1-(nonafluorobutylsulfonyl-oxyimino)-butyl]-4-biphenyl, and
2-[2,2,3,3,4,4,5,5,6,6-decafluoro-1-(nonafluorobutylsulfonyl-oxyimino)-hexyl]-4-biphenyl.

Also included are modified forms of the foregoing compounds having substituted on their skeleton
2-benzoyloxy-1,1,3,3,3-pentafluoropropanesulfonate,
1,1,3,3,3-pentafluoro-2-(4-phenylbenzoyloxyl)propanesulfonate,
1,1,3,3,3-pentafluoro-2-pivaloyloxypropanesulfonate,
2-cyclohexanecarbonyloxy-1,1,3,3,3-pentafluoropropanesulfonate,
1,1,3,3,3-pentafluoro-2-furoyloxypropanesulfonate,
2-naphthoyloxy-1,1,3,3,3-pentafluoropropanesulfonate,
2-(4-tert-butylbenzoyloxy)-1,1,3,3,3-pentafluoropropanesulfonate,
2-(1-adamantanecarbonyloxy)-1,1,3,3,3-pentafluoropropanesulfonate,
2-acetyloxy-1,1,3,3,3-pentafluoropropanesulfonate,
1,1,3,3,3-pentafluoro-2-hydroxypropanesulfonate,
1,1,3,3,3-pentafluoro-2-tosyloxypropanesulfonate,
1,1-difluoro-2-tosyloxyethanesulfonate, adamantanemethoxycarbonyldifluoromethanesulfonate,
1-(3-hydroxymethyladamantane)methoxycarbonyldifluoromethanesulfonate, methoxycarbonyldifluoromethanesulfonate,
1-(hexahydro-2-oxo-3,5-methano-2H-cyclopenta[b]furan-6-yl-oxycarbonyl)difluoromethanesulfonate, and
4-oxo-1-adamantyloxycarbonyldifluoromethanesulfonate.

Suitable oxime sulfonate generators using substituted acetonitrile derivatives include
α-(p-toluenesulfonyloxyimino)-phenylacetonitrile,
α-(p-chlorobenzenesulfonyloxyimino)-phenylacetonitrile,
α-(4-nitrobenzenesulfonyloxyimino)-phenylacetonitrile,
α-(4-nitro-2-trifluoromethylbenzenesulfonyloxyimino)-phenylacetonitrile,
α-(benzenesulfonyloxyimino)-4-chlorophenylacetonitrile,
α-(benzenesulfonyloxyimino)-2,4-dichlorophenylacetonitrile,
α-(benzenesulfonyloxyimino)-2,6-dichlorophenylacetonitrile,
α-(benzenesulfonyloxyimino)-4-methoxyphenylacetonitrile,
α-(2-chlorobenzenesulfonyloxyimino)-4-methoxyphenylacetonitrile,
α-(benzenesulfonyloxyimino)-2-thienylacetonitrile,
α-(4-dodecylbenzenesulfonyloxyimino)-phenylacetonitrile,
α-[(4-toluenesulfonyloxyimino)-4-methoxyphenyl]acetonitrile,
α-[(dodecylbenzenesulfonyloxyimino)-4-methoxyphenyl]acetonitrile,
α-(tosyloxyimino)-3-thienylacetonitrile,
α-(methylsulfonyloxyimino)-1-cyclopentenylacetonitrile,
α-(ethylsulfonyloxyimino)-1-cyclopentenylacetonitrile,
α-(isopropylsulfonyloxyimino)-1-cyclopentenylacetonitrile,
α-(n-butylsulfonyloxyimino)-1-cyclopentenylacetonitrile,
α-(ethylsulfonyloxyimino)-1-cyclohexenylacetonitrile,
α-(isopropylsulfonyloxyimino)-1-cyclohexenylacetonitrile, and
α-(n-butylsulfonyloxyimino)-1-cyclohexenylacetonitrile.

Also included are modified forms of the foregoing compounds having substituted on their skeleton
2-benzoyloxy-1,1,3,3,3-pentafluoropropanesulfonate,
1,1,3,3,3-pentafluoro-2-(4-phenylbenzoyloxyl)propanesulfonate,
1,1,3,3,3-pentafluoro-2-pivaloyloxypropanesulfonate,
2-cyclohexanecarbonyloxy-1,1,3,3,3-pentafluoropropanesulfonate,
1,1,3,3,3-pentafluoro-2-furoyloxypropanesulfonate,
2-naphthoyloxy-1,1,3,3,3-pentafluoropropanesulfonate,
2-(4-tert-butylbenzoyloxy)-1,1,3,3,3-pentafluoropropanesulfonate,
2-(1-adamantanecarbonyloxy)-1,1,3,3,3-pentafluoropropanesulfonate,
2-acetyloxy-1,1,3,3,3-pentafluoropropanesulfonate,
1,1,3,3,3-pentafluoro-2-hydroxypropanesulfonate,
1,1,3,3,3-pentafluoro-2-tosyloxypropanesulfonate,
1,1-difluoro-2-tosyloxyethanesulfonate, adamantanemethoxycarbonyldifluoromethanesulfonate,
1-(3-hydroxymethyladamantane)methoxycarbonyldifluoromethanesulfonate,
methoxycarbonyldifluoromethanesulfonate,
1-(hexahydro-2-oxo-3,5-methano-2H-cyclopenta[b]furan-6-yl-oxycarbonyl)difluoromethanesulfonate, and
4-oxo-1-adamantyloxycarbonyldifluoromethanesulfonate.

Suitable bisoxime sulfonates include
bis(α-(p-toluenesulfonyloxy)imino)-p-phenylenediacetonitrile,
bis(α-(benzenesulfonyloxy)imino)-p-phenylenediacetonitrile,
bis(α-(methanesulfonyloxy)imino)-p-phenylenediacetonitrile,
bis(α-(butanesulfonyloxy)imino)-p-phenylenediacetonitrile,
bis(α-(10-camphorsulfonyloxy)imino)-p-phenylenediacetonitrile,
bis(α-(trifluoromethanesulfonyloxy)imino)-p-phenylenediacetonitrile, bis(α-(4-methoxybenzenesulfonyloxyl)imino)-p-phenylenediacetonitrile,
bis(α-(p-toluenesulfonyloxy)imino)-m-phenylenediacetonitrile,
bis(α-(benzenesulfonyloxy)imino)-m-phenylenediacetonitrile,
bis(α-(methanesulfonyloxy)imino)-m-phenylenediacetonitrile,
bis(α-(butanesulfonyloxy)imino)-m-phenylenediacetonitrile,
bis(α-(10-camphorsulfonyloxy)imino)-m-phenylenediacetonitrile,
bis(α-(trifluoromethanesulfonyloxy)imino)-m-phenylenediacetonitrile,
bis(α-(4-methoxybenzenesulfonyloxyl)imino)-m-phenylenediacetonitrile, etc.

Also included are modified forms of the foregoing compounds having substituted on their skeleton
2-benzoyloxy-1,1,3,3,3-pentafluoropropanesulfonate,
1,1,3,3,3-pentafluoro-2-(4-phenylbenzoyloxyl)propanesulfonate,
1,1,3,3,3-pentafluoro-2-pivaloyloxypropanesulfonate,
2-cyclohexanecarbonyloxy-1,1,3,3,3-pentafluoropropanesulfonate,
1,1,3,3,3-pentafluoro-2-furoyloxypropanesulfonate,
2-naphthoyloxy-1,1,3,3,3-pentafluoropropanesulfonate,
2-(4-tert-butylbenzoyloxy)-1,1,3,3,3-pentafluoropropanesulfonate,
2-(1-adamantanecarbonyloxy)-1,1,3,3,3-pentafluoropropanesulfonate,
2-acetyloxy-1,1,3,3,3-pentafluoropropanesulfonate,
1,1,3,3,3-pentafluoro-2-hydroxypropanesulfonate,
1,1,3,3,3-pentafluoro-2-tosyloxypropanesulfonate,
1,1-difluoro-2-tosyloxyethanesulfonate, adamantanemethoxycarbonyldifluoromethanesulfonate,
1-(3-hydroxymethyladamantane)methoxycarbonyldifluoromethanesulfonate,
methoxycarbonyldifluoromethanesulfonate,
1-(hexahydro-2-oxo-3,5-methano-2H-cyclopenta[b]furan-6-yl-oxycarbonyl)difluoromethanesulfonate, and
4-oxo-1-adamantyloxycarbonyldifluoromethanesulfonate.

Among these, the preferred PAGs are sulfonium salts, bissulfonyldiazomethanes, N-sulfonyloxyimides, and sulfonyloxime compounds.

Although the optimum anion of the generated acid varies with such factors as ease of scission of the acid labile group in the polymer, an anion which is non-volatile and not extremely highly diffusive is generally selected. Appropriate anions include anions of benzenesulfonic acid, toluenesulfonic acid,
4-(4-toluenesulfonyloxyl)benzenesulfonic acid, pentafluorobenzenesulfonic acid,
2,2,2-trifluoroethanesulfonic acid, nonafluorobutanesulfonic acid, heptadecafluorooctanesulfonic acid, and camphorsulfonic acid.

The PAG (C) is added to the chemically amplified positive resist composition in an amount of 0.5 to 20 parts, preferably 1 to 10 parts by weight per 100 parts by weight of the base resin. The PAG may be used alone or in admixture of two or more. The transmittance of the resist film can be controlled by using a PAG having a low transmittance at the exposure wavelength and adjusting the amount of the PAG added.

As is well known in the art, PAGs commonly used in chemically amplified resist materials include acid generators of onium salt type and organic acid generators of non-onium salt type such as oxime sulfonate derivatives. When a chemically amplified positive resist material is patterned on a metal substrate such as copper substrate (which is subjected to plating to form solder bumps), the acid generated by the acid generator is deactivated under the influence of the substrate, or the acid generator itself behaves in such a way that it is decomposed under the influence of the substrate, losing the acid generating function. As a result, the pattern may be observed to have a degraded profile in proximity to the substrate, which is known as a footing profile or undercut profile (pattern seems to be deeply bitten). The footing profile can be transferred to solder bumps near the substrate as cutouts, with a possibility that the pattern collapses. The undercut profile also degrades the profile of solder bumps. Since the profile of resist pattern is transferred to solder bumps, the footing of solder bumps is observed. Because of such footing, the size of solder bumps near the substrate deviates from the target value.

It is desired that the resist material prevent the pattern profile from degradation such as footing or undercut when a resist pattern is formed on a metal substrate such as copper substrate (which is to be subjected to plating to form solder bumps). The addition of (D) a benzotriazole compound having the general formula (11) or (12) to the resist material is effective for avoiding the occurrence of a footing or undercut profile on the copper substrate.

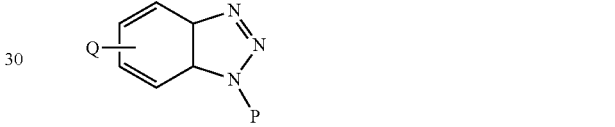

(11)

Herein P is hydrogen, hydroxyl, a substituted or unsubstituted $C_1$-$C_6$ alkyl group, preferably $C_1$-$C_4$ alkyl, a substituted or unsubstituted phenyl group, a substituent group having sulfonic acid or derivative thereof, or —Z—Y wherein Z is a $C_2$-$C_{12}$, especially $C_2$-$C_6$ alkylene group, cycloalkylene group or alkylene ether group, which may be substituted with carboxyl, and Y is a hydroxyl, $C_1$-$C_6$ alkoxy, preferably $C_2$-$C_4$ alkoxy group, carboxyl group, or dialkylamino group in which each alkyl moiety has 1 to 6 carbon atoms, especially 1 to 4 carbon atoms. Q is hydrogen, halogen, hydroxyl, $C_1$-$C_6$ alkyl group, preferably $C_1$-$C_4$ alkyl, $C_1$-$C_6$ alkoxy group, preferably $C_1$-$C_4$ alkoxy, or an organic group having the formula (13):

(13)

wherein $R^{12}$ is hydrogen or a $C_1$-$C_{12}$ alkyl group and x is 0 or 1.

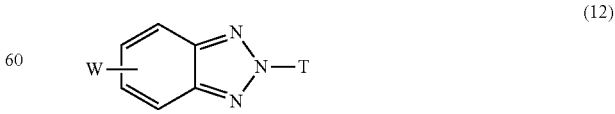

(12)

Herein T is hydrogen, hydroxyl, a $C_1$-$C_6$ alkyl group, preferably $C_1$-$C_4$ alkyl, or a phenyl group. W is hydrogen, halogen, hydroxyl, $C_1$-$C_6$ alkyl group, preferably $C_1$-$C_4$ alkyl, or $C_1$-$C_6$ alkoxy group, preferably $C_1$-$C_4$ alkoxy.

Examples of the benzotriazole compound having formula (11) or (12) include benzotriazole, 1-hydroxybenzotriazole, 1-methylbenzotriazole, 1-hydroxymethylbenzotriazole, 1-ethylbenzotriazole, 1-(1'-hydroxyethyl)benzotriazole, 1-(2'-hydroxyethyl)benzotriazole, 1-propylbenzotriazole, 1-(1'-hydroxypropyl)benzotriazole, 1-(2'-hydroxypropyl) benzotriazole, 1-(3'-hydroxypropyl)benzotriazole, 4-hydroxy-1H-benzotriazole, 5-methyl-1H-benzotriazole, benzotriazole-5-carboxylic acid, methyl benzotriazole-5-carboxylate, ethyl benzotriazole-5-carboxylate, t-butyl benzotriazole-5-carboxylate, cyclopentylethyl benzotriazole-5-carboxylate, 1H-benzotriazole-4-sulfonic acid, 1H-benzotriazole-1-acetonitrile, 1H-benzotriazole-1-carboxyaldehyde, 2-methyl-2H-benzotriazole, and 2-ethyl-2H-benzotriazole.

The benzotriazole compounds may be used alone or in admixture of two or more. Typically the benzotriazole compound is added in an amount of 0.01 to 10 parts, preferably 0.05 to 5 parts by weight per 100 parts by weight of the base resin (B). Less than 0.01 pbw of the benzotriazole compound may be less effective for preventing the resist pattern from degradation whereas more than 10 pbw may achieve little extra effect despite an increased amount or adversely affect sensitivity and film retention.

In one preferred embodiment, the resist composition further contains (F) a basic compound, with the proviso that the benzotriazole compounds of formulae (11) and (12) are excluded from the basic compound. The basic compound (F) is preferably a compound capable of suppressing the rate of diffusion when the acid generated by the PAG diffuses within the resist film. The inclusion of this type of basic compound holds down the rate of acid diffusion within the resist film, resulting in better resolution. In addition, it suppresses changes in sensitivity following exposure and reduces substrate and environment dependence, as well as improving the exposure latitude and the pattern profile.

Examples of basic compounds (F) include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine.

Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzyl amine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (B)-1 may also be included alone or in admixture.

$$N(X)c(Y)_{3-c} \qquad (B)\text{-}1$$

In the formula, c is equal to 1, 2 or 3; side chain Y is independently hydrogen or a straight, branched or cyclic $C_1$-$C_{20}$ alkyl group which may contain a hydroxyl or ether moiety; and side chain X is independently selected from groups of the following general formulas (X)-1 to (X)-3, and two or three X may bond together to form a ring with the nitrogen atom to which they are attached.

  (X)-1

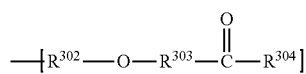  (X)-2

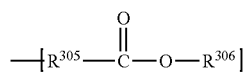  (X)-3

In the formulas, $R^{300}$, $R^{302}$ and $R^{305}$ are independently a straight or branched $C_1$-$C_4$ alkylene group. $R^{301}$ and $R^{304}$ are independently hydrogen, or a straight, branched or cyclic $C_1$-$C_{20}$ alkyl group which may contain at least one hydroxyl, ether or ester moiety or lactone ring. $R^{303}$ is a single bond or a straight or branched $C_1$-$C_4$ alkylene group. $R^{306}$ is a straight, branched or cyclic $C_1$-$C_{20}$ alkyl group which may contain at least one hydroxyl, ether or ester moiety or lactone ring.

Illustrative examples of the basic compounds of formula (B)-1 include tris(2-methoxymethoxyethyl)amine, tris{2-(2-methoxyethoxyl)ethyl}amine, tris{2-(2-methoxyethoxymethoxyl)ethyl}amine, tris{2-(1-methoxyethoxyl)ethyl}amine, tris{2-(1-ethoxyethoxyl)ethyl}amine, tris{2-(1-ethoxypropoxyl)ethyl}amine, tris[2-{2-(2-hydroxyethoxyl)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5,1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris (2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris (2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxycarbonyl] ethylamine, N,N-bis(2-acetoxyethyl)-2-[(2-oxotetrahydrofuran-3-yl)oxycarbonyl]ethylamine, N,N-bis (2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl] amine, N-(2-methoxyethyl)-bis[2-(methoxycarbonyl)ethyl] amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis (methoxycarbonylmethyl)amine, and fi-(diethylamino)-δ-valerolactone.

The basic compounds may be used alone or in admixture of two or more. The basic compound (F) is preferably formulated in an amount of 0 to 2 parts, and especially 0.01 to 1 part by weight per 100 parts by weight of the base resin. More than 2 parts of the basic compound may result in too low a sensitivity.

In one preferred embodiment, the resist composition further contains (E) a dissolution inhibitor. The preferred dissolution inhibitor is a compound having a weight average molecular weight of 100 to 1,000 and containing two or more phenolic hydroxyl groups in the molecule wherein the hydrogen of the phenolic hydroxyl group is substituted by an acid labile group in an average proportion of 10 to 100 mol %. The compound has a Mw of 100 to 1,000, preferably 150 to 800. The dissolution inhibitor, which may be used alone or in admixture, is added in an amount of 0 to 50 parts, preferably 5 to 50 parts, and more preferably 10 to 30 parts by weight per 100 parts by weight of the base resin. Too small an amount of the dissolution inhibitor may fail to achieve a resolution improvement whereas too large an amount tends to invite a pattern film thickness loss and a resolution lowering.

Illustrative, non-limiting, examples of the dissolution inhibitors which are useful herein include bis(4-(2'-tetrahydropyranyloxy)phenyl)methane, bis(4-(2'-tetrahydrofuranyloxyl)phenyl)methane, bis(4-tert-butoxyphenyl)methane,
bis(4-tert-butoxycarbonyloxyphenyl)methane,
bis(4-tert-butoxycarbonylmethyloxyphenyl)methane,
bis(4-(1'-ethoxyethoxyl)phenyl)methane,
bis(4-(1'-ethoxypropyloxy)phenyl)methane,
2,2-bis(4'-(2"-tetrahydropyranyloxy))propane,
2,2-bis(4'-(2"-tetrahydrofuranyloxy)phenyl)propane,
2,2-bis(4'-tert-butoxyphenyl)propane,
2,2-bis(4'-tert-butoxycarbonyloxyphenyl)propane,
2,2-bis(4-tert-butoxycarbonylmethyloxyphenyl)propane,
2,2-bis(4'-(1"-ethoxyethoxy)phenyl)propane,
2,2-bis(4'-(1"-ethoxypropyloxy)phenyl)propane,
tert-butyl 4,4-bis(4'-(2"-tetrahydropyranyloxy)phenyl)valerate,
tert-butyl 4,4-bis(4'-(2"-tetrahydrofuranyloxy)phenyl)valerate,
tert-butyl 4,4-bis(4'-tert-butoxyphenyl)valerate,
tert-butyl 4,4-bis(4-tert-butoxycarbonyloxyphenyl)valerate,
tert-butyl 4,4-bis(4'-tert-butoxycarbonylmethyloxyphenyl)-valerate,
tert-butyl 4,4-bis(4'-(1"-ethoxyethoxy)phenyl)valerate,
tert-butyl 4,4-bis(4'-(1"-ethoxypropyloxy)phenyl)valerate,
tris(4-(2'-tetrahydropyranyloxyl)phenyl)methane,
tris(4-(2'-tetrahydrofuranyloxyl)phenyl)methane,
tris(4-tert-butoxyphenyl)methane,
tris(4-tert-butoxycarbonyloxyphenyl)methane,
tris(4-tert-butoxycarbonyloxymethylphenyl)methane,
tris(4-(1'-ethoxyethoxyl)phenyl)methane,
tris(4-(1'-ethoxypropyloxy)phenyl)methane,
1,1,2-tris(4'-(2"-tetrahydropyranyloxy)phenyl)ethane,
1,1,2-tris(4'-(2"-tetrahydrofuranyloxy)phenyl)ethane,
1,1,2-tris(4'-tert-butoxyphenyl)ethane,
1,1,2-tris(4'-tert-butoxycarbonyloxyphenyl)ethane,
1,1,2-tris(4'-tert-butoxycarbonylmethyloxyphenyl)ethane,
1,1,2-tris(4'-(1'-ethoxyethoxyl)phenyl)ethane, and
1,1,2-tris(4'-(1'-ethoxypropyloxyl)phenyl)ethane.

If desired, any additives such as leveling agents, dyes, pigments and surfactants may be added to the resist composition.

Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megaface F171, F172 and F173 (DIC Corp.), Fluorad FC-430 and FC-431 (Sumitomo 3M Co., Ltd.), Surfynol E1004 (Nissin Chemical Industry Co., Ltd.), Asahiguard AG710, Surflon S-381, S-382, SC101, SC102, SC103, SC104, SC105, SC106, KH-10, KH-20, KH-30 and KH-40 (AGC Seimi Chemical Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC-430, Surflon S-381, Surfynol E1004, KH-20 and KH-30 are preferred. These surfactants may be used alone or in admixture.

In the resist composition, the surfactant is formulated in an amount of up to 2 parts, and preferably up to 1 part by weight per 100 parts by weight of the base resin.

In the resist composition, other optional components may be added, for example, a light absorbing substance for reducing diffuse reflection from the substrate, a compound having 1,2-naphthoquinonediazidesulfonyl group in the molecule, and a dissolution accelerator. Such optional components may be added in conventional amounts as long as they do not compromise the benefits of the invention.

Suitable light absorbing substances include azo compounds such as 2-benzeneazo-4-methylphenol and 4-hydroxy-4'-dimethylaminoazobenzene, and curcumin.

The compounds having 1,2-naphthoquinonediazidesulfonyl group in the molecule include compounds having in the molecule a 1,2-naphthoquinonediazidesulfonyl group represented by the general formula (17) or (18). Examples of the parent compound into which a 1,2-naphthoquinonediazidesulfonyl group is introduced include tri- or tetrahydroxybenzophenone, ballast molecules having a phenolic hydroxyl group as represented by the general formula (17), and novolac resins comprising recurring units of the following formula (18) and having a Mw of 2,000 to 20,000, preferably 3,000 to 10,000.

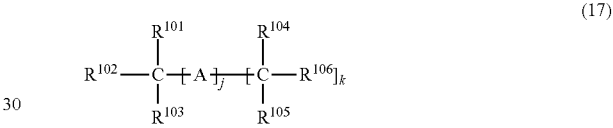

(17)

Herein $R^{101}$ to $R^{106}$ are each independently hydrogen, methyl, a group of formula (19), or a group of formula (20), j is an integer of 0 to 2, k is an integer of 0 to 2, with the proviso that j is 1 or 2 when k=0. When k is 0 and j is 1, A is hydrogen, methyl or a group of formula (19). When k is 0 and j is 2, one A is methylene or a group of formula (21), and the other A is hydrogen, methyl or a group of formula (19). When k is 1, A is methylene or a group of formula (21). When k is 2 and j is 1, A is methine or a group of formula (22). When j is 2, one A is methylene or a group of formula (21), and the other A is methine or a group of formula (22).

(19)

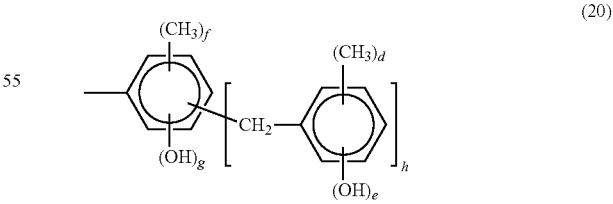

(20)

(21)

-continued

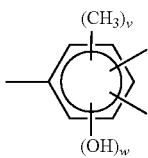
(22)

The subscripts d, e, f, g, h, v, and w each are an integer of 0 to 3, satisfying d+e 5, f+g 4, and v+w 3.

The low nuclear compound (or ballast molecule) of formula (17) is preferably designed such that the number of benzene rings is 2 to 20, more preferably 2 to 10, and even more preferably 3 to 6 benzene rings, and a ratio of the number of phenolic hydroxyl groups to the number of benzene rings is from 0.5/1 to 2.5/1, more preferably from 0.7 to 2.0, and even more preferably from 0.8 to 1.5.

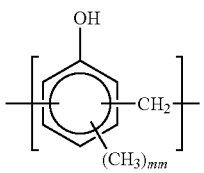
(18)

Herein, mm is an integer of 0 to 3.

The novolac resin of formula (18) may be synthesized by carrying out condensation reaction of a phenol having the following formula (23) with an aldehyde by a standard method.

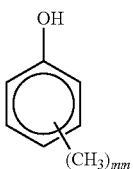
(23)

Herein, mm is an integer of 0 to 3.

Examples of the phenol having formula (23) include o-cresol, m-cresol, p-cresol, and 3,5-xylenol, which may be used alone or in admixture. Examples of the aldehyde include formaldehyde, paraformaldehyde, acetaldehyde, and benzaldehyde, with formaldehyde being preferred.

The phenol of formula (23) and the aldehyde are preferably combined in a molar ratio of 0.2/1 to 2/1, more preferably 0.3 to 2.

The preferred method of introducing a 1,2-naphthoquinonediazidesulfonyl group into the parent compound is by dehydrochlorination condensation reaction of 1,2-naphthoquinonediazidesulfonyl chloride with phenolic hydroxyl group in the presence of a base catalyst. When the parent compound is a ballast molecule of formula (17) or tri- or tetrahydroxybenzophenone, the hydrogen of phenolic hydroxyl group is preferably substituted by 1,2-naphthoquinonediazidesulfonyl in a proportion of 10 to 100 mol %, more preferably 50 to 100 mol %. When the parent compound is a novolac resin of formula (18), the hydrogen of phenolic hydroxyl group is preferably substituted by 1,2-naphthoquinonediazidesulfonyl in a proportion of 2 to 50 mol %, more preferably 3 to 27 mol %.

The compound having a 1,2-naphthoquinonediazidesulfonyl group in the molecule is preferably added in an amount of 0.1 to 15 parts, more preferably 0.5 to 10 parts by weight to 80 parts by weight of the base resin. Less than 0.1 part of the compound may be ineffective for improving the resolution of the resist composition whereas more than 15 parts may adversely affect the sensitivity.

Typically the dissolution accelerator is a low nuclear compound of formula (17), defined above, in which the number of benzene rings is 2 to 20, more preferably 2 to 10, and even more preferably 3 to 6 benzene rings, and a ratio of the number of phenolic hydroxyl groups to the number of benzene rings is from 0.5/1 to 2.5/1, more preferably from 0.7 to 2.0, and even more preferably from 0.8 to 1.5. Examples of the low nuclear compound are shown below as (E-1) to (E-44).

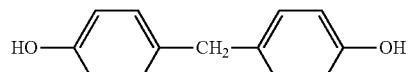
(E-1)

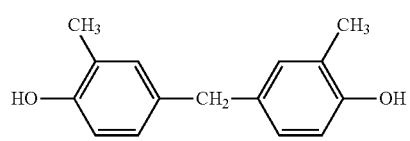
(E-2)

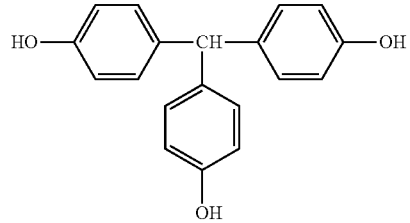
(E-3)

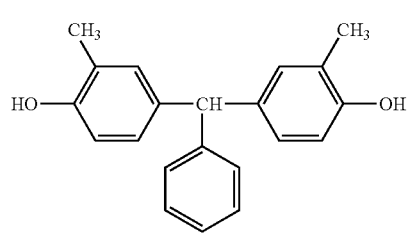
(E-4)

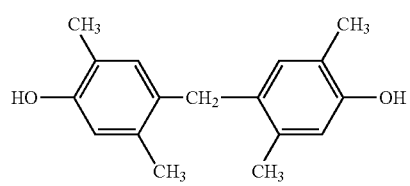
(E-5)

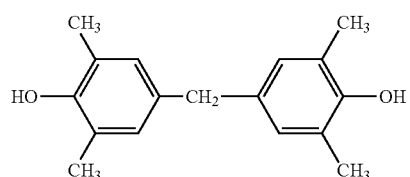
(E-6)

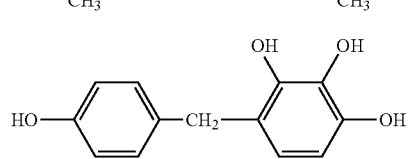
(E-7)

(E-8)
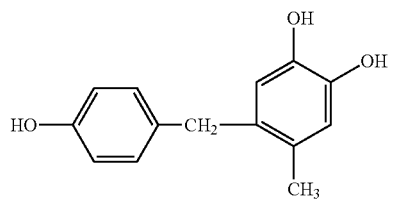
(E-9)
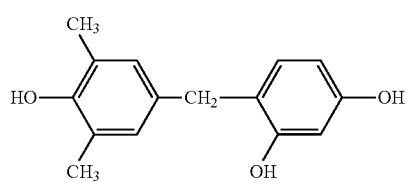
(E-10)
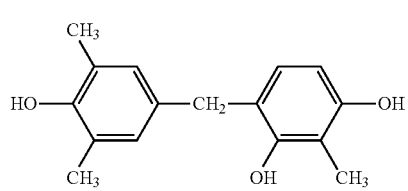
(E-11)
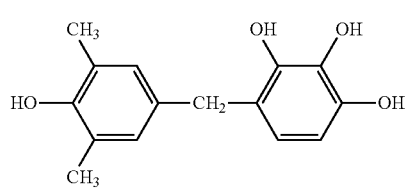
(E-12)
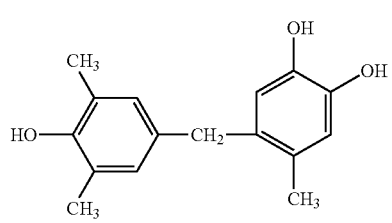
(E-13)
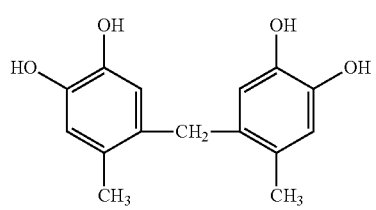
(E-14)
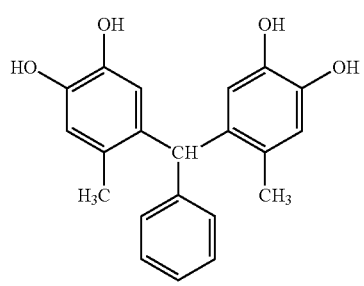
(E-15)
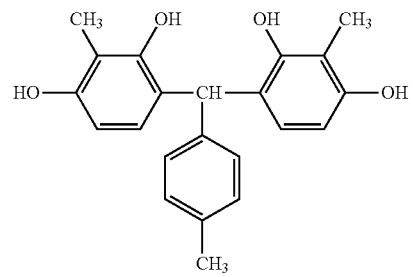
(E-16)
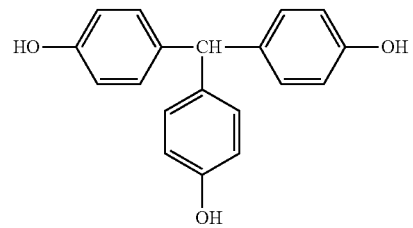
(E-17)
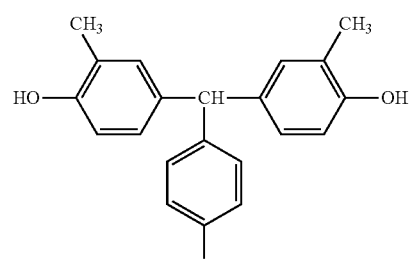
(E-18)
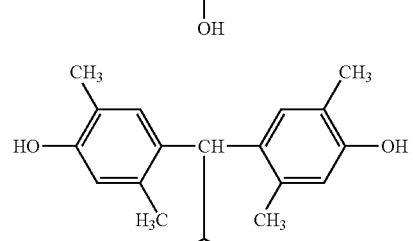
(E-19)
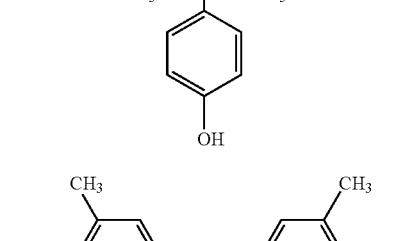
(E-20)
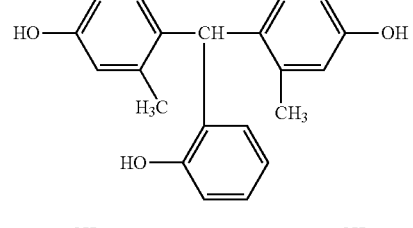

-continued
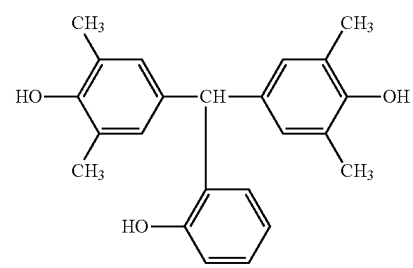
(E-21)
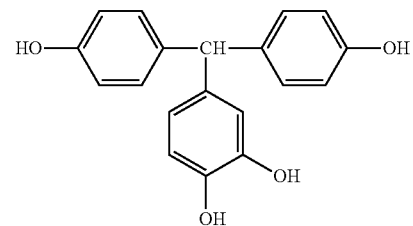
(E-22)
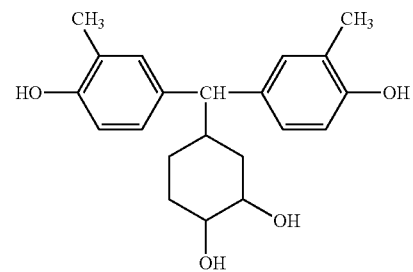
(E-23)
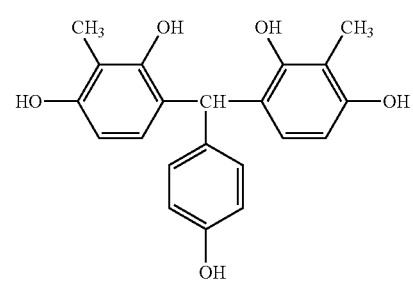
(E-24)
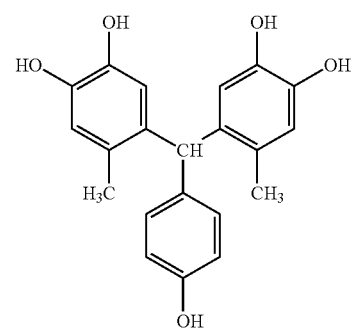
(E-25)
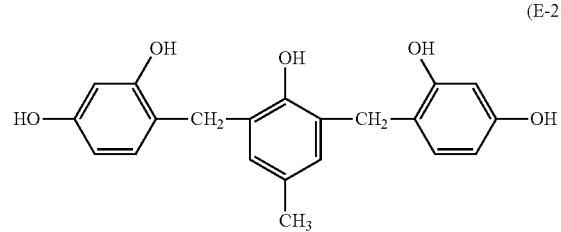
(E-26)
-continued
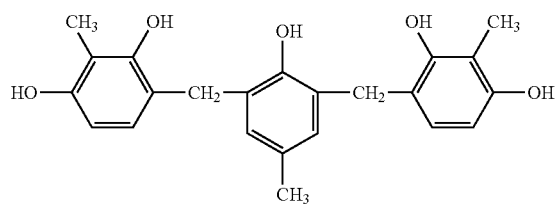
(E-27)
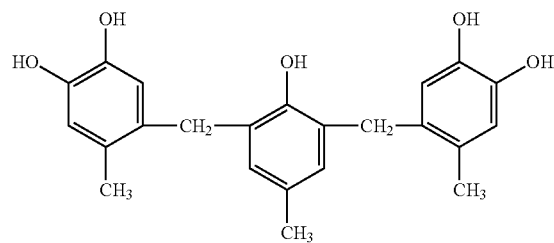
(E-28)
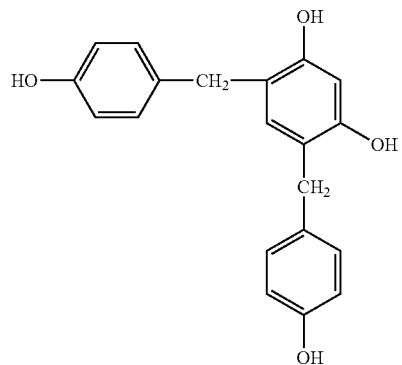
(E-29)
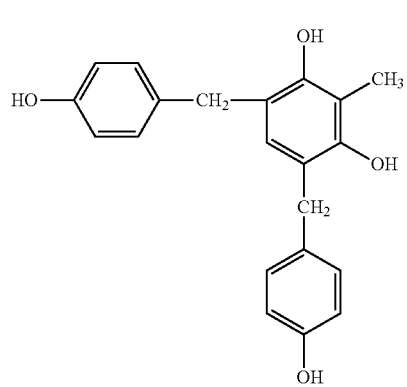
(E-30)
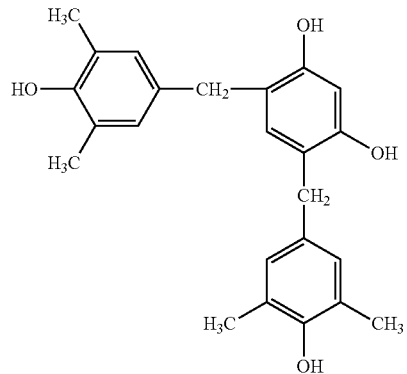
(E-31)

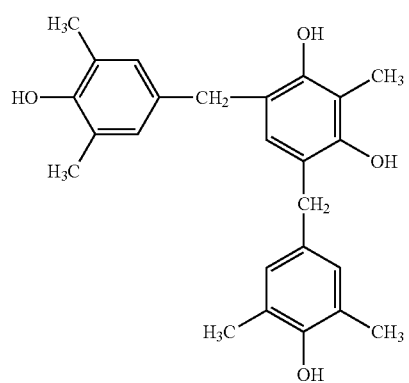
(E-32)
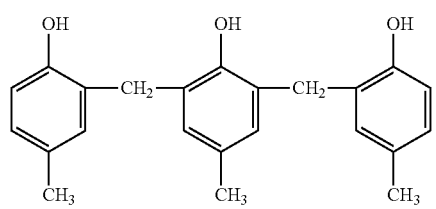
(E-33)
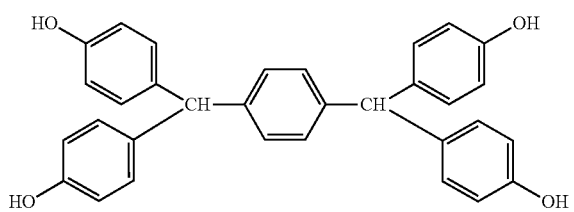
(E-34)
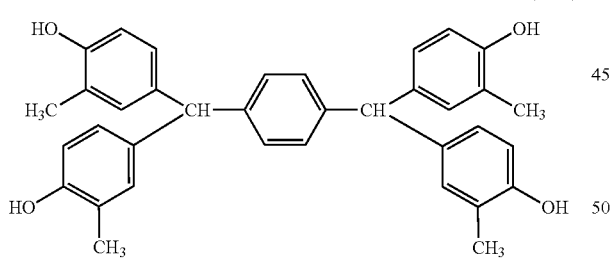
(E-35)
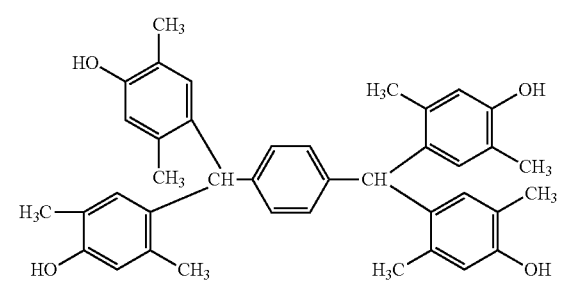
(E-36)
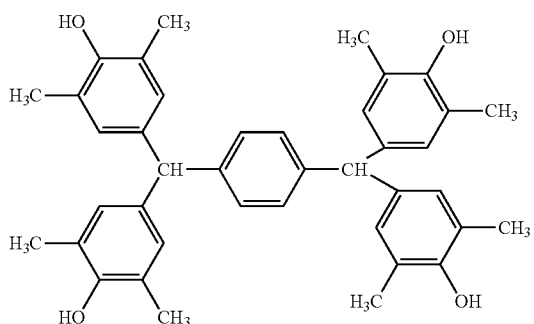
(E-37)
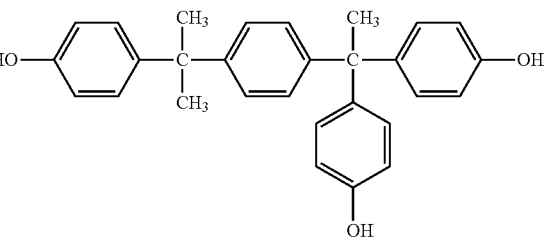
(E-38)
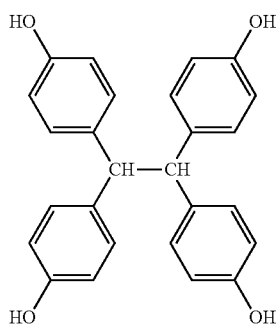
(E-39)
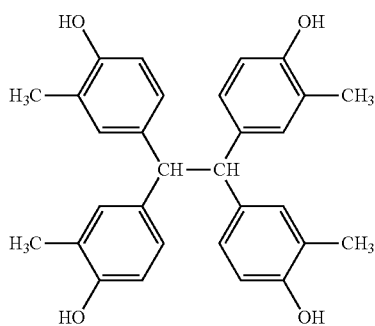
(E-40)
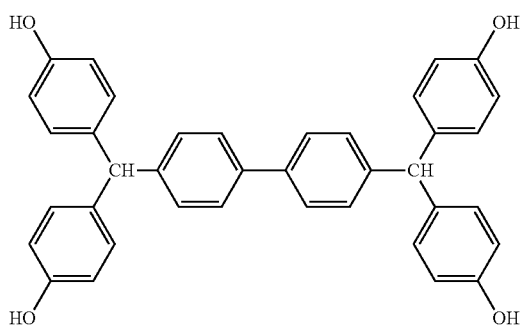
(E-41)

-continued

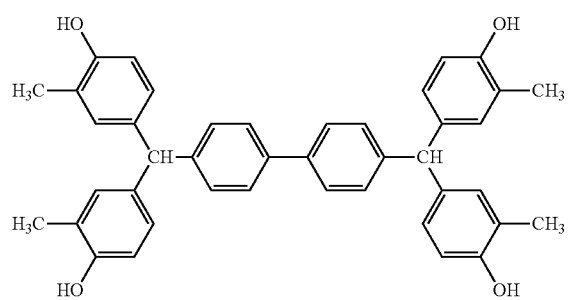
(E-42)

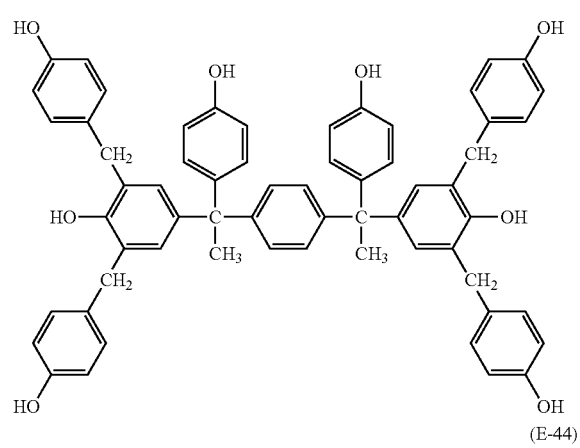
(E-43)

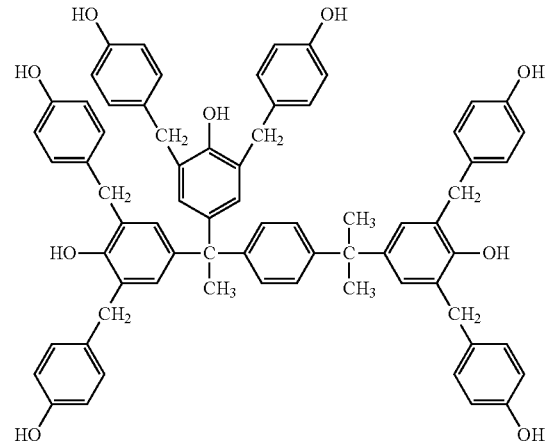
(E-44)

The dissolution accelerator, which may be used alone or in admixture, is preferably added in an amount of 0 to 10 parts, more preferably 0.05 to 5 parts by weight to 80 parts by weight of the base resin. More than 10 parts of the dissolution accelerator may adversely affect resolution and heat resistance.

Process

The positive resist composition of the invention may be used to form a pattern by any well-known lithography processes. For example, the resist composition is applied onto a substrate by suitable coating techniques, typically spin coating. The substrate may be a silicon wafer or a substrate having an electroconductive layer on its surface, for example, a substrate having a metal film of gold, silver, copper, nickel or the like formed by sputtering, evaporation or plating. The coating is prebaked at a temperature of 80 to 130° C. for 50 to 600 seconds to form a resist film having a thickness of 5 to 100 μm, preferably 10 to 80 μm, more preferably 20 to 80 μm, and most preferably 30 to 70 μm. Through a mask having a desired pattern held above the resist film, the resist film is then exposed to high-energy radiation having a wavelength of up to 500 nm, such as i-line or g-line. The exposure dose is preferably in the range of about 1 to 5,000 mJ/cm$^2$, more preferably about 100 to 2,000 mJ/cm$^2$. If desired, the film may be baked (PEB) on a hot plate at 60 to 150° C. for 1 to 10 minutes, preferably 80 to 120° C. for 1 to 5 minutes. Thereafter the resist film is developed with a developer in the form of an aqueous base solution, for example, 0.1 to 5 wt %, preferably 2 to 3 wt % aqueous solution of tetramethylammonium hydroxide (TMAH) for 0.5 to 20 minutes, preferably 1 to 10 minutes by conventional techniques such as dip, puddle or spray development. In this way, a desired resist pattern is formed on the substrate. After the development, post-bake may be effected at 50 to 100° C. for 10 to 600 seconds if desired.

Next, a metal pattern is formed on the resist pattern-bearing substrate. Specifically, electroplating or electroless plating may be carried out to form a metal pattern on the substrate. Examples of the metal to be plated include Au, Ag, Cu, Fe, Ni and the like. The metal film preferably has a thickness of 5 to 100 μm, more preferably 10 to 70 μm, and even more preferably 10 to 60 μm.

In the case of electroplating, a metal film may be deposited in a plating bath containing a metal ion and a mineral acid (e.g., nitric acid, sulfuric acid, hydrochloric acid or hydrofluoric acid) by conducting electric current at a current density of 0.5 to 20 A/dm$^2$ for about 0.5 minute to 3 hours.

The electroless plating may be either displacement plating or reduction plating. The substrate is immersed in a commonly used plating bath containing a metal salt (e.g., sulfite, thiosulfate or chloride), a complexing agent, a reducing agent, and the like, at 5 to 80° C.

Optional additives such as well-known surfactants may be added to the electroplating and electroless plating baths. Not only single layer plating, but also multilayer plating by a combination of electroplating and electroless plating are acceptable.

The resulting plating layer may be heat treated if desired. The resist is removed using a suitable solvent, leaving the metal pattern-bearing substrate which is ready for use in the intended application.

EXAMPLE

Examples of the invention are given below by way of illustration and not by way of limitation.

Examples 1 to 18

A resist solution was prepared by selecting two polymers: Polymer 1, 2 or 3 and Polymer 4, 5, 6, 7, 8 or 9 having recurring units identified below as the base resin, an acid generator (PAG-1 or PAG-2), a benzotriazole compound (B-1), a basic compound (Amine-1), and a surfactant in accordance with the formulation shown in Table 1, dissolving them in propylene glycol monomethyl ether acetate (PGMEA), and filtering through a membrane filter having a pore size of 1.0 μm. The resist solution was spin coated onto a substrate (which was a 6-inch silicon wafer having copper deposited thereon by sputtering), and soft baked on a hot plate under the conditions shown in Table 2 to form a resist film having a thickness of 50.0 μm.

Comparative Examples 1 to 4

A resist solution was prepared as in Examples aside from using Polymer 2 and Polymer 10 or 11 having recurring units identified below as the base resin. The resist solution was spin coated onto a substrate (which was a 6-inch silicon wafer having copper deposited thereon by sputtering), and soft baked on a hot plate under the conditions shown in Table 2 to form a resist film having a thickness of 50.0 μm.

Polymer 1

(Polymer-1)

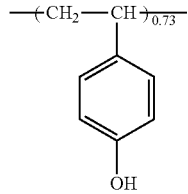 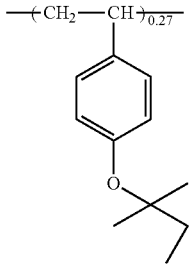

Mw = 7,400
Mw/Mn = 1.05

Polymer 2

(Polymer-2)

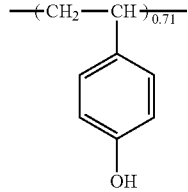 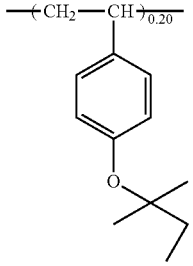

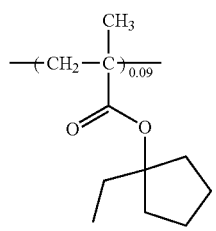

Mw = 12,000
Mw/Mn = 1.85

Polymer 3

(Polymer-3)

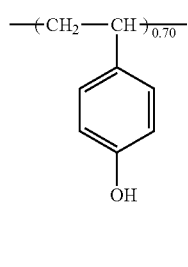 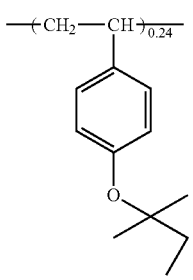

-continued

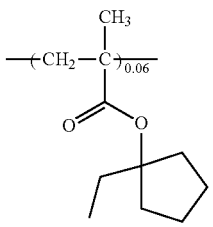

Mw = 15,000
Mw/Mn = 1.95

Polymer 4

(Polymer-4)

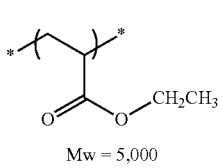

Mw = 5,000
Mw/Mn = 2.01

Polymer 5

(Polymer-5)

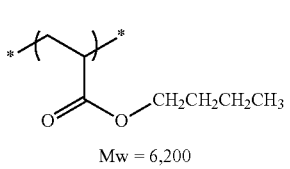

Mw = 6,200
Mw/Mn = 1.97

Polymer 6

(Polymer-6)

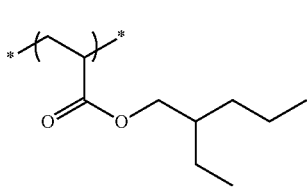

Mw = 4,600
Mw/Mn = 1.90

Polymer 7

(Polymer-7)

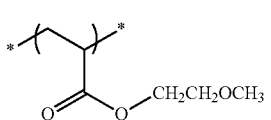

Mw = 11,000
Mw/Mn = 1.97

Polymer 8

(Polymer-8)

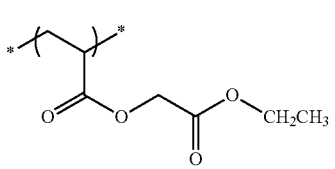

Mw = 7,700
Mw/Mn = 1.95

Polymer 9

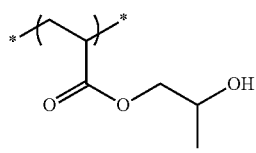

Mw = 4,400
Mw/Mn = 1.95

Polymer 10

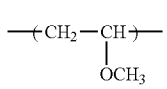

Mw = 80,000
Mw/Mn = 4.44

Polymer 11

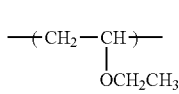

Mw = 124,000
Mw/Mn = 5.10

PAG-1

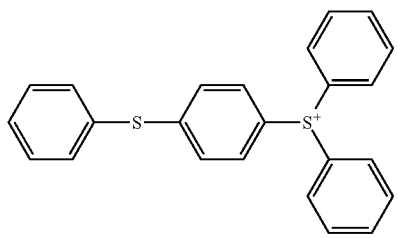

(PAG-1)

PAG-2

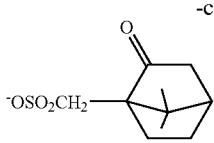

(PAG-2)

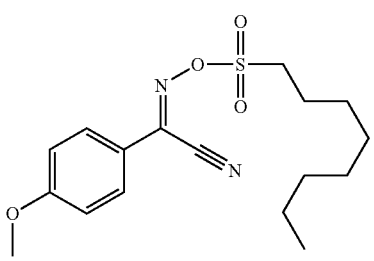

Benzotriazole compound B-1

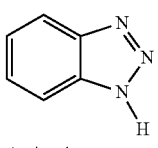

(B-1)

Amine-1

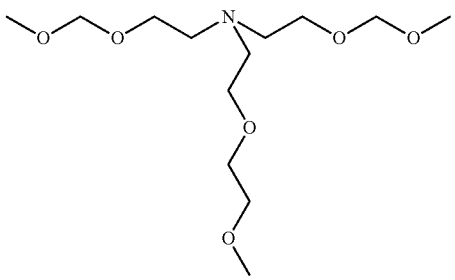

(Amine-1)

TABLE 1

|  |  | Base resin | PAG | Benzotriazole | Basic compound | Solvent |
|---|---|---|---|---|---|---|
| Example | 1 | Polymer-1(70) | Polymer-4(10) | PAG-1(1.5) | B-1(0.05) | — | PGMEA(95) |
|  | 2 | Polymer-1(70) | Polymer-7(10) | PAG-1(1.5) | B-1(0.05) | — | PGMEA(95) |
|  | 3 | Polymer-2(70) | Polymer-4(10) | PAG-1(1.5) | B-1(0.05) | — | PGMEA(95) |
|  | 4 | Polymer-2(70) | Polymer-5(10) | PAG-1(1.5) | B-1(0.05) | — | PGMEA(95) |
|  | 5 | Polymer-2(70) | Polymer-6(10) | PAG-1(1.5) | B-1(0.05) | — | PGMEA(95) |
|  | 6 | Polymer-2(70) | Polymer-7(10) | PAG-1(1.5) | B-1(0.05) | — | PGMEA(95) |
|  | 7 | Polymer-2(70) | Polymer-8(10) | PAG-1(1.5) | B-1(0.05) | — | PGMEA(95) |
|  | 8 | Polymer-2(70) | Polymer-9(10) | PAG-1(1.5) | B-1(0.05) | — | PGMEA(95) |
|  | 9 | Polymer-2(70) | Polymer-4(10) | PAG-2(1.5) | B-1(0.05) | — | PGMEA(95) |
|  | 10 | Polymer-2(70) | Polymer-5(10) | PAG-2(1.5) | B-1(0.05) | — | PGMEA(95) |
|  | 11 | Polymer-2(70) | Polymer-4(10) | PAG-1(1.5) | B-1(0.05) | Amine-1(0.1) | PGMEA(95) |
|  | 12 | Polymer-2(70) | Polymer-5(10) | PAG-1(1.5) | B-1(0.05) | Amine-1(0.1) | PGMEA(95) |
|  | 13 | Polymer-3(70) | Polymer-4(10) | PAG-1(1.5) | B-1(0.05) | — | PGMEA(95) |
|  | 14 | Polymer-3(70) | Polymer-5(10) | PAG-1(1.5) | B-1(0.05) | — | PGMEA(95) |
|  | 15 | Polymer-3(70) | Polymer-6(10) | PAG-1(1.5) | B-1(0.05) | — | PGMEA(95) |
|  | 16 | Polymer-3(70) | Polymer-7(10) | PAG-1(1.5) | B-1(0.05) | — | PGMEA(95) |
|  | 17 | Polymer-3(70) | Polymer-8(10) | PAG-1(1.5) | B-1(0.05) | — | PGMEA(95) |
|  | 18 | Polymer-3(70) | Polymer-9(10) | PAG-1(1.5) | B-1(0.05) | — | PGMEA(95) |
| Comparative Example | 1 | Polymer-2(70) | Polymer-10(10) | PAG-1(1.5) | B-1(0.05) | — | PGMEA(95) |
|  | 2 | Polymer-2(70) | Polymer-10(10) | PAG-2(1.5) | B-1(0.05) | — | PGMEA(95) |
|  | 3 | Polymer-2(70) | Polymer-11(10) | PAG-1(1.5) | B-1(0.05) | — | PGMEA(95) |
|  | 4 | Polymer-2(70) | Polymer-11(10) | PAG-2(1.5) | B-1(0.05) | — | PGMEA(95) |

The value in parentheses is in parts by weight.

It is noted that the surfactant used is 0.02 part by weight of X-70-093 (surfactant having perfluoroalkyl-containing siloxane group combined with polyoxyethylene type polyether group, available from Shin-Etsu Chemical Co., Ltd.)

Patterning of Resist Composition

Next, using an i-line stepper NSR-1755i7A (Nikon Corp., NA=0.50), the resist film was exposed to i-line through a reticle. The resist film was baked (PEB) under the conditions shown in Table 2 and developed with a 2.38 wt % tetramethylammonium hydroxide aqueous solution. Specifically, development was carried out by dispensing the developer to the substrate for 10 seconds while spinning the substrate, and holding the developer stationary on the resist film for 50 seconds. The step of dispensing and static holding the developer was repeated 6 times. This was followed by deionized water rinsing and drying.

The resist pattern resulting from development was observed under a scanning electron microscope (SEM). The sensitivity was defined as the exposure dose (mJ/cm$^2$) which resolved a 20-µm 1:1 contact hole pattern to the mask size of 20 µm, with the results shown in Table 2. The profile of a 20-µm 1:1 contact hole pattern at the dose is also reported in Table 2. It was confirmed whether or not scum or residue was left on the bottom of contact holes. It was also confirmed whether or not the pattern deformed and/or collapsed owing to generation of bubbles or the like.

Crack Resistance Test

After the resist pattern was formed as above, the resist pattern and the substrate surface was treated with an oxygen plasma by operating a dry etching system DEM-451 (Nichiden Anelva Co., Ltd.) at 100 W for 30 seconds, to effect ashing. The substrate was immersed in a gold plating bath (Tanaka Precious Metals K.K., Microfab Au100, pH 4.6), where electroplating of gold was carried out by a constant current flow at 60° C. for 100 minutes, depositing a gold layer of about 15 µm thick. After plating, the surface was washed with flowing deionized water. The resist surface was observed under an optical microscope and SEM. The resist film was examined for deformation and cracking by growth stress of plating. With respect to crack resistance, 4,500 points or crack-sensitive corners on a resist pattern as shown in FIG. 1 were inspected. The number of cracks generated was counted. The sample was rated high crack resistance when the count was less than 100 points among 4,500 points. The results are shown in Table 3. In FIG. 1, "A" designates a crack inspecting area which includes 6×5×5=150 points within one shot ranging from 50 µm to 10 µm, indicating that on the entire wafer surface (30 shots, shown left), 150×30=4,500 points were inspected.

TABLE 2

|  |  | Soft bake (° C./120 sec) | PEB (° C./120 sec) | Sensitivity (mJ/cm$^2$) | Pattern profile | Pattern bottom observed | Bubbles |
|---|---|---|---|---|---|---|---|
| Example | 1 | 130 | 110 | 800 | rectangular | neither footing nor scum | nil |
|  | 2 | 130 | 110 | 850 | rectangular | neither footing nor scum | nil |
|  | 3 | 130 | 110 | 900 | rectangular | neither footing nor scum | nil |
|  | 4 | 130 | 110 | 900 | rectangular | neither footing nor scum | nil |
|  | 5 | 130 | 110 | 850 | rectangular | neither footing nor scum | nil |
|  | 6 | 130 | 110 | 800 | rectangular | neither footing nor scum | nil |
|  | 7 | 130 | 110 | 800 | rectangular | neither footing nor scum | nil |
|  | 8 | 130 | 110 | 950 | rectangular | neither footing nor scum | nil |
|  | 9 | 130 | 110 | 700 | rectangular | neither footing nor scum | nil |
|  | 10 | 130 | 110 | 700 | rectangular | neither footing nor scum | nil |
|  | 11 | 130 | 110 | 1,100 | rectangular | neither footing nor scum | nil |
|  | 12 | 130 | 110 | 1,100 | rectangular | neither footing nor scum | nil |
|  | 13 | 130 | 110 | PAG-1(1.5) | rectangular | neither footing nor scum | nil |
|  | 14 | 130 | 110 | 800 | rectangular | neither footing nor scum | nil |
|  | 15 | 130 | 110 | 800 | rectangular | neither footing nor scum | nil |
|  | 16 | 130 | 110 | 850 | rectangular | neither footing nor scum | nil |
|  | 17 | 130 | 110 | 800 | rectangular | neither footing nor scum | nil |
|  | 18 | 130 | 110 | 800 | rectangular | neither footing nor scum | nil |
| Comparative Example | 1 | 130 | 110 | — | not opened | — | nil |
|  | 2 | 130 | 110 | — | not opened | — | nil |
|  | 3 | 130 | 110 | 1,200 | forward tapered | footing and scum observed | nil |
|  | 4 | 130 | 110 | 1,200 | forward tapered | footing and scum observed | nil |

Solder Plating Bath Test

After the resist pattern was formed as above, the substrate was immersed in a plating bath. Thereafter, the resist pattern was observed under SEM. The sample was rated good when the resist pattern after plating bath immersion was unchanged from the resist pattern prior to immersion. The results are shown in Table 3.

The plating bath conditions included an electroplating bath TS-120 (Sn—Ag alloy plating solution, Ishihara Chemical Co., Ltd.), 25° C., and 120 minutes of immersion.

TABLE 3

|  | Crack resistance test | Solder plating bath test |
| --- | --- | --- |
| Example 1 | good | unchanged |
| Example 2 | good | unchanged |
| Example 3 | good | unchanged |
| Example 4 | good | unchanged |
| Example 5 | good | unchanged |
| Example 6 | good | unchanged |
| Example 7 | good | unchanged |
| Example 8 | good | unchanged |
| Example 9 | good | unchanged |
| Example 10 | good | unchanged |
| Example 11 | good | unchanged |
| Example 12 | good | unchanged |
| Example 13 | good | unchanged |
| Example 14 | good | unchanged |
| Example 15 | good | unchanged |
| Example 16 | good | unchanged |
| Example 17 | good | unchanged |
| Example 18 | good | unchanged |

Japanese Patent Application No. 2014-118737 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified positive resist composition comprising (A) an organic solvent, (B) a base resin, and (C) an acid generator, said base resin (B) comprising a first polymer comprising recurring units represented by the general formula (1) and having a weight average molecular weight of 1,000 to 500,000, and a second polymer comprising recurring units of acrylate or methacrylate represented by the general formula (2) and having a weight average molecular weight of 1,000 to 500,000,

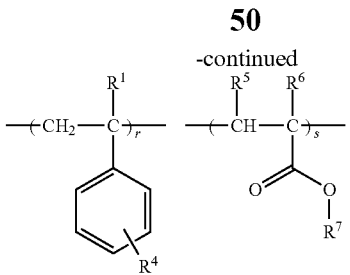

(1)

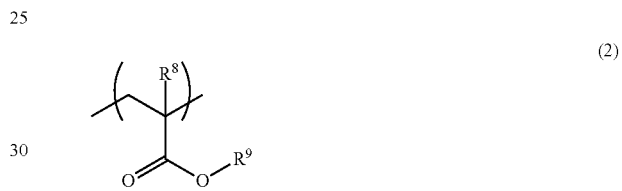

wherein $R^1$ is hydrogen, hydroxyl, straight alkyl, branched alkyl, halogen or trifluoromethyl, $R^2$ is hydrogen, hydroxyl, halogen or trifluoromethyl, $R^3$ is $C_4$-$C_{12}$ tertiary alkyl, $R^4$ is hydrogen, an optionally substituted alkyl group, optionally substituted alkoxy group, —$C(CF_3)_2$—OH, trialkylsiloxy group in which each alkyl moiety has 1 to 6 carbon atoms, $C_4$-$C_{20}$ oxoalkoxy group, tetrahydropyranyloxy group, tetrahydrofuranyloxy group, or trialkylsiloxy group, $R^5$ is hydrogen or methyl, $R^6$ is hydrogen, methyl, alkoxycarbonyl, cyano, halogen or trifluoromethyl, $R^7$ is $C_4$-$C_{30}$ alkyl, n is 0 or a positive integer of 1 to 4, m is 0 or a positive integer of 1 to 5, p and r each are 0 or a positive number, s is a positive number, q is a positive number, and p+q+r+s=1, (2)

wherein $R^8$ is hydrogen or methyl, and $R^9$ is selected from the group consisting of a straight, branched or cyclic $C_2$-$C_{24}$ alkyl group, a $C_2$-$C_{12}$ alkoxyalkyl group, a $C_1$-$C_{12}$ hydroxyalkyl group, an organic group of the formula (3):

$$-(RO)_n-R'$$ (3)

wherein R is $C_2$-$C_4$ alkylene, R' is $C_1$-$C_6$ alkyl, and n is an integer of 1 to 6, and an organic group of the formula (4):

$$-CH_2-\underset{\underset{O}{\|}}{C}-O-R''$$ (4)

wherein R" is a straight, branched or cyclic $C_1$-$C_{12}$ alkyl group, a $C_2$-$C_{12}$ alkoxyalkyl group, a $C_1$-$C_{12}$ hydroxyalkyl group, or a $C_3$-$C_{12}$ (poly)alkylene glycol alkyl group.

2. The resist composition of claim 1 wherein $R^8$ in formula (2) is hydrogen.

3. The resist composition of claim 1 wherein the first polymer comprises recurring units of at least one type selected from the following formulae (6) and (7):

(6)

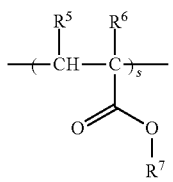

wherein $R^1$, $R^2$, $R^3$, $R^5$, $R^6$, $R^7$, m, and n are as defined for formula (1), p, q and s are positive numbers, p+q+s=1, (7)

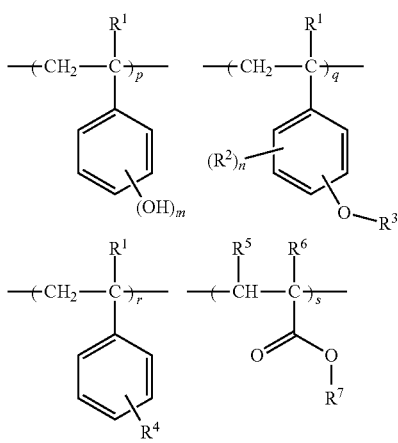

wherein $R^1$, $R^2$, $R^3$, $R^4$, $R^5$, $R^6$, $R^7$, m, and n are as defined for formula (1), p, q, r and s are positive numbers, p+q+r+s=1.

4. The resist composition of claim 1 wherein the optionally substituted alkoxy group of $R^4$ is a group of the following formula (8), a group of the following formula (9), or a straight, branched or cyclic $C_4$-$C_{20}$ tertiary alkoxy group, (8)

(9)

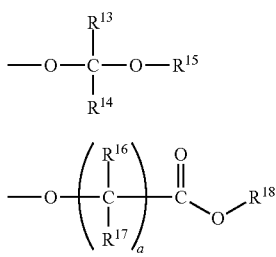

wherein $R^{13}$, $R^{14}$, $R^{15}$, $R^{16}$, and $R^{17}$ are each independently hydrogen, or a straight or branched $C_1$-$C_8$ alkyl group, a pair of $R^{13}$ and $R^{14}$, $R^{13}$ and $R^{15}$, or $R^{14}$ and $R^{15}$ may bond together to form a ring with the carbon atom or the carbon and oxygen atoms to which they are attached, each of $R^{13}$, $R^{14}$, and $R^{15}$ is a straight or branched $C_1$-$C_{18}$ alkylene group when they form a ring, $R^{18}$ is a straight, branched or cyclic $C_4$-$C_{40}$ alkyl group, and a is 0 or an integer of 1 to 4.

5. The resist composition of claim 1 wherein the first polymer comprises recurring units of the following formula (10):

(10)

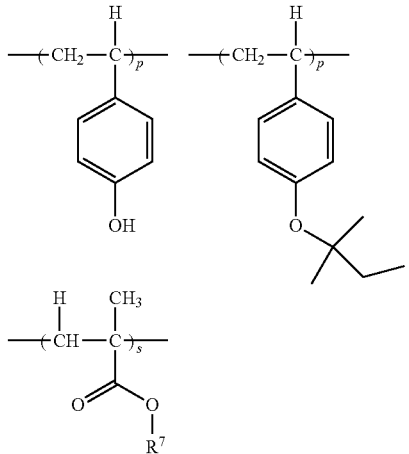

wherein $R^7$ is as defined for formula (1), p, q and s are positive numbers, p+q+s=1.

6. The resist composition of claim 1, further comprising (D) a benzotriazole compound having the general formula (11) or (12):

(11)

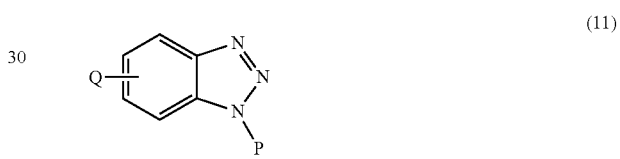

wherein P is hydrogen, hydroxyl, an optionally substituted $C_1$-$C_6$ alkyl, optionally substituted phenyl, substituent group having sulfonic acid or derivative thereof, or —Z—Y, Z is a $C_2$-$C_{12}$ alkylene, cycloalkylene or alkylene ether group which may be substituted with carboxyl, Y is a hydroxyl, $C_1$-$C_6$ alkoxy group, carboxyl group or dialkylamino group in which each alkyl moiety has 1 to 6 carbon atoms, Q is hydrogen, halogen, hydroxyl, $C_1$-$C_6$ alkyl, $C_1$-$C_6$ alkoxy group or an organic group having the formula (13):

(13)

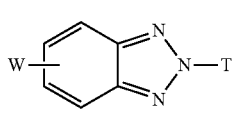

wherein $R^{12}$ is hydrogen or $C_1$-$C_{12}$ alkyl, x is 0 or 1, (12)

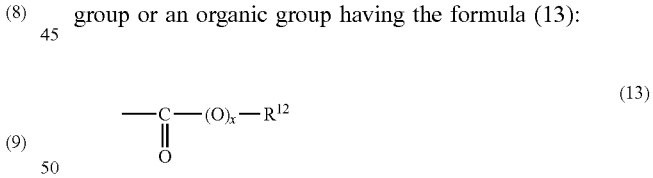

wherein T is hydrogen, hydroxyl, $C_1$-$C_6$ alkyl, or phenyl group, and W is hydrogen, halogen, hydroxyl, $C_1$-$C_6$ alkyl or $C_1$-$C_6$ alkoxy group.

7. The resist composition of claim 1, further comprising (E) a dissolution inhibitor.

8. The resist composition of claim 1, further comprising (F) a basic compound, with the proviso that the benzotriazole compound of the following formula (11) or (12) is excluded from the basic compound:

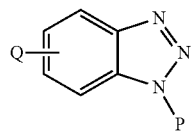
(11)

wherein P is hydrogen, hydroxyl, an optionally substituted $C_1$-$C_6$ alkyl, optionally substituted phenyl, substituent group having sulfonic acid or derivative thereof, or —Z—Y, Z is a $C_2$-$C_{12}$ alkylene, cycloalkylene or alkylene ether group which may be substituted with carboxyl, Y is a hydroxyl, $C_1$-$C_6$ alkoxy group, carboxyl group or dialkylamino group in which each alkyl moiety has 1 to 6 carbon atoms, Q is hydrogen, halogen, hydroxyl, $C_1$-$C_6$ alkyl, $C_1$-$C_6$ alkoxy group or an organic group having the formula (13):

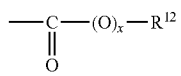
(13)

wherein $R^{12}$ is hydrogen or $C_1$-$C_{12}$ alkyl, x is 0 or 1,

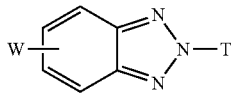
(12)

wherein T is hydrogen, hydroxyl, $C_1$-$C_6$ alkyl, or phenyl group, and W is hydrogen, halogen, hydroxyl, $C_1$-$C_6$ alkyl or $C_1$-$C_6$ alkoxy group.

9. A pattern forming process comprising the steps of:
(i) coating the resist composition of claim 1 onto a substrate and prebaking to form a resist film,
(ii) exposing the resist film to UV radiation having a wavelength of up to 500 nm through a photomask, and
(iii) optionally baking, and developing with a developer to form a resist pattern.

10. The process of claim 9 wherein the substrate is a substrate having a conductive layer on its surface, and the process further comprises, after the developing step (iii),
(iv) subjecting the resist pattern-bearing substrate to ashing with an oxygen plasma for thereby removing any resist residue on the pattern and rendering the resist film surface hydrophilic,
(v) performing electroplating or electroless plating using the resist pattern as a mold, for thereby depositing a metal pattern on the conductive substrate to a predetermined thickness, and
(vi) removing the resist component which has served as the mold for depositing the metal pattern, from the substrate.

11. The process of claim 9 wherein the resist film has a thickness of 5 to 100 μm.

12. The resist composition of claim 1 wherein the second polymer consists of recurring units of acrylate or methacrylate represented by the general formula (2).

* * * * *